United States Patent
Robinson et al.

(10) Patent No.: US 9,307,616 B2
(45) Date of Patent: Apr. 5, 2016

(54) METHOD, SYSTEM AND APPARATUS FOR DYNAMICALLY MONITORING AND CALIBRATING DISPLAY TILES

(71) Applicant: Christie Digital Systems USA, INC., Cypress, CA (US)

(72) Inventors: James Robinson, Elmira (CA); Marc Lemieux, Guelph (CA)

(73) Assignee: CHRISTIE DIGITAL SYSTEMS USA, INC., Cypress, CA (US)

( * ) Notice: Subject to any disclaimer, the term of this patent is extended or adjusted under 35 U.S.C. 154(b) by 0 days.

(21) Appl. No.: 14/713,034

(22) Filed: May 15, 2015

(65) Prior Publication Data
US 2015/0257239 A1    Sep. 10, 2015

Related U.S. Application Data

(63) Continuation of application No. 14/139,910, filed on Dec. 24, 2013, now Pat. No. 9,059,337.

(51) Int. Cl.
*H01L 33/00* (2010.01)
*H05B 37/02* (2006.01)
(Continued)

(52) U.S. Cl.
CPC .......... *H05B 37/0227* (2013.01); *G06F 3/1446* (2013.01); *G09G 3/32* (2013.01);
(Continued)

(58) Field of Classification Search
CPC ..... H01L 33/62; H01L 33/0004; H01L 33/64; G09G 3/32; G09G 3/342; G09G 5/12; G09G 2320/045; G09G 2320/069; G09G 2320/0233; G09G 2320/029; G09G 2360/145; H05B 33/0851; H05B 33/0869; H05B 33/0896
See application file for complete search history.

(56) References Cited

U.S. PATENT DOCUMENTS 4,703,175 A * 10/1987 Salour ................... G01K 11/14
                                                        250/227.23
6,630,801 B2 * 10/2003 Schuurmans ...... H05B 33/0869
                                                        315/307
(Continued)

FOREIGN PATENT DOCUMENTS

NL       2004025615 A1      3/2004

OTHER PUBLICATIONS

Robinson, James, et al., "Method, System and Apparatus for Dynamically Monitoring and Calibrating Display Tiles", U.S. Appl. No. 14/139,910, filed Dec. 24, 2013.
(Continued)

*Primary Examiner* — Nikolay Yushin
(74) *Attorney, Agent, or Firm* — Perry + Currier, Inc.

(57) ABSTRACT

A method, system and apparatus for dynamically monitoring and calibrating display tiles are provided. The apparatus comprises: an array of light emitting devices; one or more light emitting devices paired with light emitting devices of the array; one or more sensors configured to detect an optical characteristic and/or an electrical characteristic of the one or more paired light emitting devices; and, circuitry configured to: drive the array; drive each of the one or more further light emitting devices under same conditions as light emitting devices of the array; temporarily drive each of the one or more paired light emitting devices under different conditions from the array; and, adjust driving of the array based on the optical characteristic and/or electrical characteristic of the one or more paired light emitting devices detected at sensor(s) when the one or more paired light emitting devices are driven under the different conditions.

12 Claims, 12 Drawing Sheets

(51) Int. Cl.
*H01L 33/62* (2010.01)
*G09G 3/32* (2006.01)
*G09G 3/34* (2006.01)
*G09G 5/12* (2006.01)
*H05B 33/08* (2006.01)
*G06F 3/14* (2006.01)
*H01L 33/64* (2010.01)

(52) U.S. Cl.
CPC .............. *G09G 3/342* (2013.01); *G09G 5/12* (2013.01); *H01L 33/0004* (2013.01); *H01L 33/62* (2013.01); *H05B 33/0851* (2013.01); *H05B 33/0869* (2013.01); *H05B 33/0896* (2013.01); *G09G 2300/0417* (2013.01); *G09G 2320/029* (2013.01); *G09G 2320/0233* (2013.01); *G09G 2320/041* (2013.01); *G09G 2320/045* (2013.01); *G09G 2320/0666* (2013.01); *G09G 2320/0693* (2013.01); *G09G 2330/02* (2013.01); *G09G 2330/12* (2013.01); *G09G 2360/145* (2013.01); *H01L 33/64* (2013.01)

(56) References Cited

U.S. PATENT DOCUMENTS

| | | | | |
|---|---|---|---|---|
| 6,753,661 | B2 * | 6/2004 | Muthu | G09G 3/3413 315/149 |
| 7,959,341 | B2 * | 6/2011 | Erchak | G01J 1/32 345/102 |
| 8,896,227 | B2 * | 11/2014 | Moskowitz | H05B 33/0809 315/209 R |
| 2003/0230991 | A1 * | 12/2003 | Muthu | G09G 3/3413 315/307 |
| 2008/0018570 | A1 | 1/2008 | Gerets | |
| 2008/0019147 | A1 * | 1/2008 | Erchak | G01J 1/32 362/607 |
| 2012/0229030 | A1 * | 9/2012 | Moskowitz | H05B 33/0809 315/122 |
| 2014/0361696 | A1 * | 12/2014 | Siessegger | H05B 33/0803 315/186 |

OTHER PUBLICATIONS

Corresponding European Patent Application No. EP 14 19 4988 Search Report dated May 8, 2015.

* cited by examiner

METHOD, SYSTEM AND APPARATUS FOR DYNAMICALLY MONITORING AND CALIBRATING DISPLAY TILES

FIELD

The specification relates generally to displays, and specifically to a method, system and apparatus for dynamically monitoring and calibrating display tiles.

BACKGROUND

Light emitting diode (LED) wall installations are composed of a plurality of discrete LED tiles, each consisting of an array of discrete red/green/blue (RGB) LEDs. Care is taken in manufacturing LED tiles to ensure that good color uniformity exists across the individual LEDs of each tile by: careful color and intensity binning of the LEDs during manufacture; and, measuring the optical characteristics of each individual LED after assembly to apply a correction factor so that every LED is color and intensity calibrated to each other within a single tile. Extending this level of LED to LED brightness and color accuracy from tile to tile is not trivial: for any given LED wall installation, all LED tiles are selected from the same color bins and calibrated as part of the same production lot. Hence an end user is required to purchase 10% to 20% extra LED tiles at build time, to have the additional LED tiles available in the event of a future tile failure requiring replacement, and/or to have the flexibility to reconfigure the wall at a future date.

SUMMARY

In general, this disclosure is directed to a device comprising a display tile, and/or a light emitting tile, for use in a display wall. The light emitting tiles can be physically tiled together and can be controlled to display an image, with each of the light emitting tiles providing a portion of the image. Respective light emitting devices located, for example, interior to a given light emitting tile, and are driven similar to light emitting devices that form a respective portion of the image at the given light emitting tile. Hence, the interior light emitting devices can be colloquially referred to being "paired" with and/or "twinned" with light emitting devices of the display tile. Periodically, a test pattern is provided at the interior twinned light emitting devices, and one or more optical characteristics of the given light emitting tile are measured using an optical sensor receiving light from the twinned light emitting devices. A central computing device that is, for example providing the image to the light emitting tiles, receives the one or more optical characteristics (e.g. brightness and/or intensity and/or a colour coordinate and/or a white point and/or a color space) of the light emitting tiles, and one more or more optical characteristics of one or more of the light emitting tiles in the display wall can be adjusted to match neighbouring light emitting tiles. However, the twinned light emitting devices need not be located interior to the light emitting tile.

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XYY, YZ, ZZ, and the like). Similar logic can be applied for two or more items in any occurrence of "at least one . . . " and "one or more . . . " language.

An aspect of the present specification provides a device comprising: an array of light emitting devices; one or more further light emitting devices paired with respective light emitting devices of the array; one or more sensors configured to detect one or more of an optical characteristic and an electrical characteristic of the one or more further light emitting devices; and, circuitry configured to: drive the array of light emitting devices; drive each of the one or more further light emitting devices under same conditions as respective paired light emitting devices of the array; temporarily drive each of the one or more further light emitting devices under different conditions as the respective paired light emitting devices of the array; and, adjust driving of the array of light emitting devices based on one or more of the optical characteristic and the electrical characteristic of the one or more further light emitting devices detected at the one or more sensors when the one or more further light emitting devices are driven under the different conditions.

The device can further comprise a light guide configured to guide light emitted from the one or more further light emitting devices to the one or more sensors, when the one or more sensors includes an optical sensor. The light guide can comprise one or more of at least one light pipe, at least one light channeling film and at least one optical fibre.

The device can further comprise a chassis configured to support the array. The one or more further light emitting devices and the one or more sensors can be located on a side of the chassis opposite the array. The device can further comprise a light guide configured to guide the light from the one or more further light emitting devices to the one or more sensors, when the one or more sensors can comprise an optical sensor.

The circuitry can be further configured to drive the one or more further light emitting devices in a test pattern when temporarily driving each of the one or more further light emitting devices under the different conditions as the respective paired light emitting devices of the array. The circuitry can be further configured to drive the one or more further light emitting devices in the test pattern by controlling the one or more further light emitting devices to emit one or more of white light, light in a greyscale, red light, green light and blue light.

The circuitry can be further configured to temporarily drive each of the one or more further light emitting devices under different conditions by driving each of the one or more further light emitting devices in a test pattern.

The optical characteristic can comprise one or more of a colour coordinate, a white point, and an intensity of the one or more further light emitting devices.

The electrical characteristic can comprise one or more of an operating power, an operating voltage and an operating current of the one or more further light emitting devices.

The device can further comprise at least one or more temperature sensors configured to measure a temperature difference between the array and the one or more further light emitting devices, wherein adjusting driving of the array is further based on the temperature difference.

Another aspect of the specification provides a method comprising: driving an array of light emitting devices; driving each of one or more further light emitting devices under same conditions as respective paired light emitting devices of the array; temporarily driving each of the one or more further light emitting devices under different conditions than the respective paired light emitting devices of the array; detecting, using one or more sensors, one or more of a optical characteristic and an electrical characteristic of the one or more further light emitting devices when driven under the different conditions; and, adjust driving of the array of light emitting devices based on one or more of the optical characteristic and the electrical characteristic of the one or more further light emitting devices.

A further aspect of the specification provides a system comprising: a plurality of light emitting tiles, each can comprise: an array of light emitting devices; one or more further light emitting devices paired with respective light emitting devices of the array; one or more sensors configured to detect one or more of a optical characteristic and an electrical characteristic of the one or more further light emitting devices; and, circuitry configured to: drive the array of light emitting devices; drive each of the one or more further light emitting devices under same conditions as respective paired light emitting devices of the array; and, temporarily drive each of the one or more further light emitting devices under different conditions as the respective paired light emitting devices of the array; and at least one computing device in communication with the plurality of light emitting tiles, the at least one computing device configured to: receive, from respective sensors of each of the plurality of light emitting tiles, one or more of a respective optical characteristic and a respective electrical characteristic of respective one or more further light emitting devices when respectively driven under respective different conditions; determine one or more of a common optical characteristic and a common electrical characteristic from one or more of the respective optical characteristic and the respective electrical characteristic; and, communicate one or more of the common optical characteristic and the common electrical characteristic to one or more of the plurality of light emitting tiles so that respective circuitry can drive each respective array according to one or more of the common optical characteristic and the common electrical characteristic.

The common characteristic can comprise one or more of a common white point, at least one common colour coordinate, a common intensity, a common operating power, a common operating voltage and a common operating current.

Another aspect of the specification provides a device comprising: an array of light emitting devices; a sensor configured to detect an electrical characteristic of one or more of the light emitting devices; and, circuitry configured to: drive the array of light emitting devices to provide an image; temporarily drive each of the light emitting devices to provide a test pattern; and, adjust driving of the array of light emitting devices to provide the image based on the electrical characteristic of the one or more light emitting devices detected at the sensor when the one or more light emitting devices are driven according to the test pattern.

The circuitry can be further configured to temporarily drive each of the light emitting devices to provide the test pattern by driving each of the light emitting devices to one or more of a given current and a given voltage.

The sensor can be further configured to one or more of: detect the electrical characteristic of one or more of the light emitting devices by measuring one or more of a resulting voltage and a resulting power, when each of the light emitting devices is driven to the given current; and, detect the electrical characteristic of one or more of the light emitting devices by measuring one or more of a resulting current and the resulting power, when each of the light emitting devices is driven to the given voltage.

The circuitry can be further configured to temporarily drive each of the light emitting devices to provide the test pattern by individually and sequentially driving each of the light emitting devices to one or more of a given current and a given voltage while the image is being provided at the array. A sequence in which each of the light emitting devices is driven in the test pattern can be random. A sequence in which each of the light emitting devices is driven can comprise one or more raster patterns.

The circuitry can be further configured to temporarily drive each of the light emitting devices to provide the test pattern by interrupting displaying of image and providing the test pattern

BRIEF DESCRIPTIONS OF THE DRAWINGS

For a better understanding of the various implementations described herein and to show more clearly how they may be carried into effect, reference will now be made, by way of example only, to the accompanying drawings in which.

DETAILED DESCRIPTION

Figure 1:
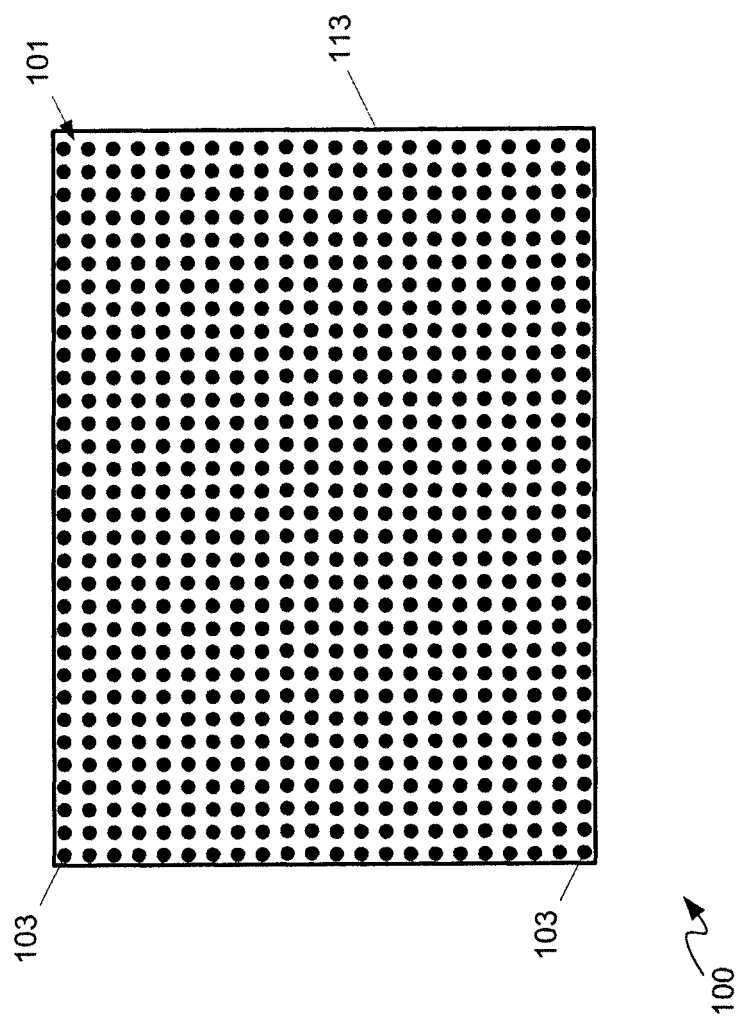
FIG. 1 depicts a front view of a device comprising a light emitting tile, according to non-limiting implementations.
Figure 2:
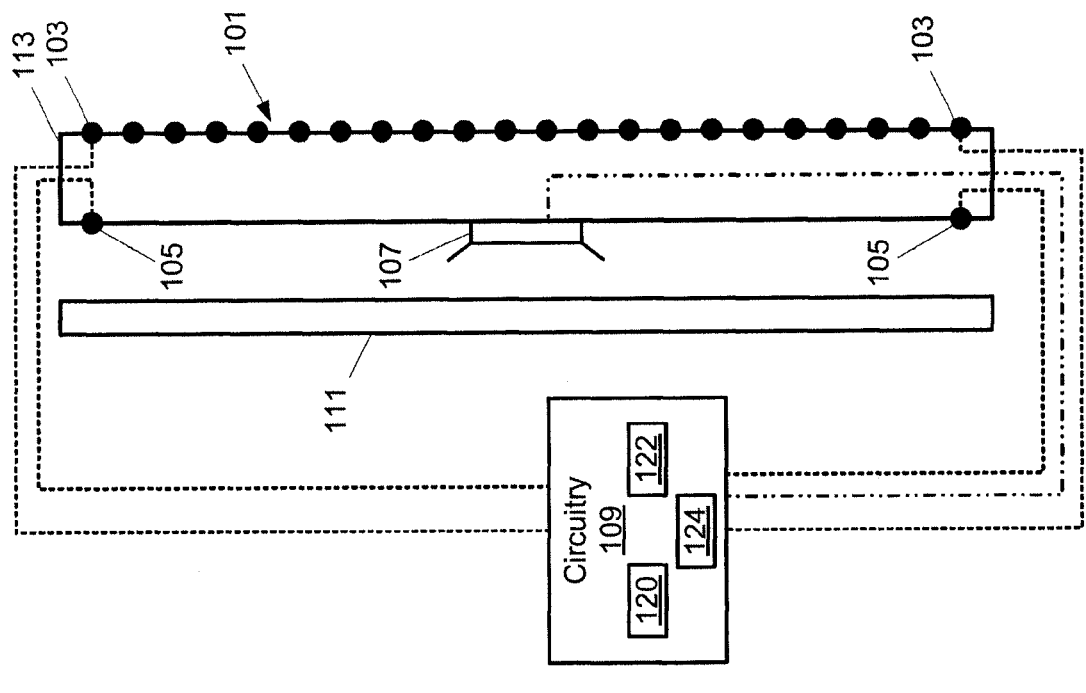
FIG. 2 depicts a schematic side view of the device of FIG. 1, according to non-limiting implementations.

FIGS. 1 and 2 respectively depict a front view and a side schematic view of a device 100 comprising a light emitting tile which can be arranged in an array of other light emitting tiles to form a display wall. Device 100 comprises: an array 101 of light emitting devices 103 (only two of which are indicated in FIGS. 1 and 2); one or more further light emitting devices 105 paired with respective light emitting devices 103 of the array 101; an optical sensor 107 configured to detect one or more optical characteristics of one or more further light emitting devices 105; and, circuitry 109 configured to: drive array 101 of light emitting devices 103; drive each of the one or more further light emitting devices 105 under same conditions as respective paired light emitting devices 105 of array 101; temporarily drive each of one or more further light emitting devices 105 under different conditions as respective paired light emitting devices 103 of array 101; and, adjust driving of array 101 of light emitting devices 103 based on the optical characteristic of one or more further light emitting devices 105 detected at optical sensor 107 when one or more further light emitting devices 105 are driven under the different conditions.

In depicted implementations, device 100 further comprises a light guide 111 configured to guide light emitted from one or more further light emitting devices 105 to optical sensor 107. Light guide 111 can include, but is not limited to, one or more of at least one light pipe, a light mixing device, at least one light channeling film and at least one optical fibre. As depicted, light guide 111 comprises a light channeling film that accepts light from one or more further light emitting device 105 and channels the light to optical sensor 107. The light channeling film can be supported, at least in part, by a frame 113 and/or a chassis and/or internal supporting members within device 100.

In depicted implementations, device 100 further comprises the frame 113 configured to support array 101. Frame 113 can be further configured to connect to one or more of another device, similar to device 100, in a display wall, and a display wall frame, and the like. In general, however, device 100 is configured to be incorporated into a display wall. Frame 113 can comprise any suitable combination of plastic and/or metal, and can further comprise fasteners and/or fastening devices for fastening device 100 to other similar devices and/or a display wall frame and/or a display wall. Furthermore, while depicted in schematic, frame 113 can enclose further light emitting devices 105, sensor 107, circuitry 109, light guide 111 and any other elements of device 100; alternatively, device 100 can further comprise a chassis enclosing elements of device 100, and frame 113 can be integrated with and/or attached to the chassis. In implementations including a chassis different from frame 113, the chassis can alternatively be configured to connect to one or more of another device, similar to device 100, in a display wall, and a display wall frame, and the like.

In general, array 101 is driven by circuitry 109 to display images, video and the like, by controlling each light emitting device 103 in array 101 to form the images, video and the like, for example by controlling the voltage and current of each of light emitting device 105 to emit light of a given color and/or at a given brightness. In other words, each light emitting device 103 comprises a pixel in array 101.

Circuitry 109 hence generally comprises a processor 120 interconnected with a memory 122 and a communication interface 124 (referred interchangeably hereafter as interface 124). Processor 120 can be implemented as a plurality of processors, including but not limited to one or more central processors (CPUs) and/or a plurality of transistors. Processor 120 is configured to communicate with memory 122 comprising a non-volatile storage unit (e.g. Erasable Electronic Programmable Read Only Memory ("EEPROM"), Flash Memory, and the like) and a volatile storage unit (e.g. random access memory ("RAM"), and the like). Programming instructions that implement the functional teachings of device 100 as described herein are typically maintained, persistently, in memory 122 and used by processor 120 which makes appropriate utilization of volatile storage during the execution of such programming instructions. In some implementations, processor 120 comprises at least a portion of memory 122, for example as on-board random access memory (RAM). It is further appreciated that memory 122 is an example of computer readable media that can store programming instructions executable on processor 120. Furthermore, memory 122 is also an example of a memory unit and/or memory module.

Interface 124 is generally configured to interconnect with light emitting devices 103 of array 101, further light emitting devices 105, optical sensor 107, and with one or more of respective circuitry of other similar devices and/or a computing device for controlling device 100. For example, the computing device can provide an image to be provided at array 101. Circuitry 109 can further comprise a power supply and/or a connector to a power supply external to device 100.

In specific non-limiting implementations, each light emitting device 103 and each further light emitting device 105 can comprise one or more light emitting diodes (LEDs), for example a red LED, a green LED and a blue LED. In these implementations, circuitry 109 can drive each LED in each light emitting device 103 to a color commensurate with a respective pixel in an image being displayed at array 101. However, in other implementations, array 101 and/or each light emitting device 103 can comprise a plasma device, and organic light emitting diode (OLED) device, a liquid crystal device (LCD) and the like. Regardless, each further light emitting device 105 and its paired and/or twinned light emitting device 103 in array 101 are of a same type: for example, each further light emitting device 105 and its paired light emitting device 103 are each a similar type LED, a similar type plasma device, a similar type OLED device, a similar type LCD, etc. Further, when the light emitting devices 103 are chosen from a common bin, so that all light emitting devices 103 are of a similar color and/or brightness, each further light emitting device 105 is also chosen from the same common bin.

Optical sensor 107 can include, but is not limited to one or more of a brightness detector, an intensity detector, a photodetector, a colorimeter, a white point detector, a colour coordinate detector and the like. Indeed, optical sensor 107 is generally configured to detect one or more optical characteristics including, but not limited to one or more of brightness, intensity, a color, a colour coordinate, a white point, a color space and the like. Further, while output from optical sensor 107 is described herein with respect to one or more optical characteristics, such output can be represented in terms of signals and/or data that is proportional to one or more optical characteristics. For example, optical sensor 107 can be configured to output a value to circuitry 109 that corresponds to a measured brightness, for example on a scale of 0 to 255, and/or as a variable current, but that need not directly represent brightness in a given units systems, such as lumens and the like.

While, as depicted, circuitry 109 is shown as being in communication with two light emitting devices 103 of array 101, for example via interface 124 and links depicted in broken lines for clarity, it is appreciated that circuitry 109 is configured to control all light emitting devices 103. Similarly, while FIG. 2 depicts two further light emitting devices 105, it is appreciated that device 100 can comprise as few as one further light emitting device 105 and as many as a same number of light emitting devices 103 in array 101. Circuitry 109 is further in communication with each one or more further light emitting devices 105 of array 101, via interface 124 and links depicted in broken lines for clarity. The links depicted in broken lines can comprise any combination of wiring and/or connections and/or wireless connections and/or communications between circuitry 109 and light emitting devices 103, 105.

As depicted, array 101 is generally arranged on and/or at an external side of frame 113 and/or an outward facing side of frame 113. As depicted, one or more further light emitting devices 105 and optical sensor 107 are located on a side of frame 113 opposite array 101, for example an internal surface of frame 113, and/or an inward facing side of frame 113. Frame 113 is hence further configured to hide one or more of one or more further light emitting devices 105, optical sensor 107 and light guide 109. In other words, frame 113 is further configured to shield light emitted by one or more further light emitting devices 105, for example, from a viewer viewing array 101.

In depicted implementations, light guide 111 is also located on the same side of frame 113 as one or more further light emitting devices 105 and optical sensor 107. One or more further light emitting devices 105 and optical sensor 107 are located at and/or on and/or mounted to a same surface of frame 113; in implementations where light guide 111 comprises a light channeling film, light guide 111 can be located about parallel to the surface where one or more further light emitting devices 105 and optical sensor 107 are located.

However, in other implementations, one or more further light emitting devices 105 and optical sensor 107 can be located in any suitable position where one or more further light emitting devices 105 can be driven under the same conditions as respective paired light emitting devices 103, and where optical sensor 107 can detect light emitted by one or more further light emitting devices 105. For example, light guide 111 can comprise one or more optical fibers and/or one or more light pipes, and the like, for channeling light to optical sensor 107; in such implementations, one or more further light emitting devices 105 and/or optical sensor 107 can be located anywhere within device 100 and/or external to frame 113. However, one or more further light emitting devices 105 and/or optical sensor 107 could alternatively be located on an exterior of device 100; in some of these implementations, frame 113, and/or a chassis of device 100, can hide one or more further light emitting devices 105 and/or optical sensor 107, for example from a viewer of array 101.

In some implementations, one or more further light emitting devices 105 can be clustered together, and a light gathering side of optical sensor 107 can face one or more further light emitting devices 105 to collect light there from, obviating light guide 111.

Figure 3:
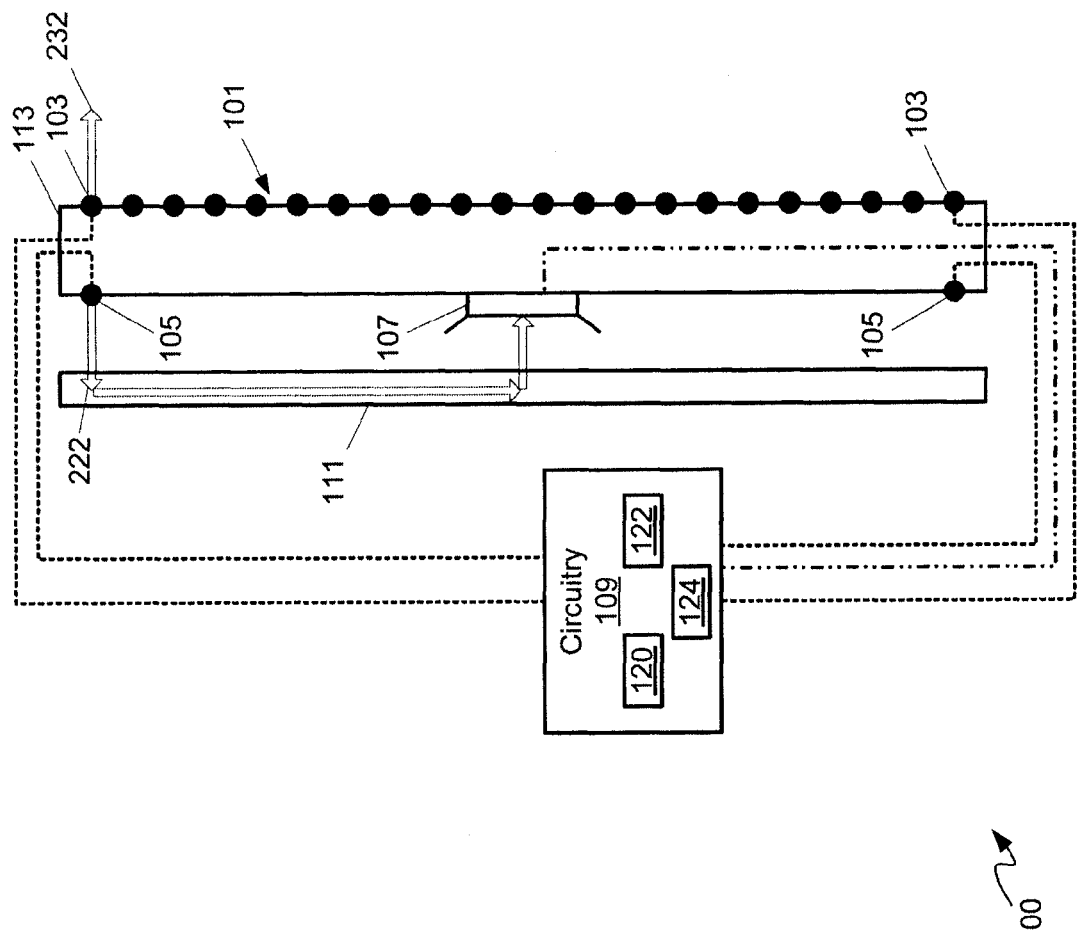
FIG. 3 depicts the device of FIG. 2 in operation with twinned light emitting devices being driven under similar conditions to an array of light emitting devices, according to non-limiting implementations.

Attention is next directed to FIG. 3, which is substantially similar to FIG. 2, with like elements having like numbers. However, FIG. 3 depicts one of further light emitting devices 105 emitting light 222 towards light guide 111, which collects light 222 and guides light 222 to optical sensor 107. When light guide 111 comprises at least one light channeling film, areas of the light channeling film proximal each of the one or more further light emitting devices 105 are configured to collect light 222, and an area of light channeling film proximal optical sensor 107 is configured to emit light 222 towards a light collecting side of optical sensor 107.

As depicted circuitry 109 can be in further communication with optical sensor 107, via interface 124 and a link depicted as a dash/dot line for clarity. The link depicted in dash/dot lines can comprise any combination of wiring and/or connections and/or wireless connections and/or communications between circuitry 109 and optical sensor 107. As described above, optical sensor 107 is generally configured to detect one or more optical characteristics including, but not limited to one or more of brightness, intensity, a color, a colour coordinate, a white point, a color space and the like, for example when light 222 is collected at optical sensor 107. For example, light 222 interacts with optical sensor 107 and optical sensor 107 converts light 222 into a signal and/or data which, as depicted, can be conveyed to circuitry 109, the signal and/or data indicative of the one or more optical characteristics of light 222.

In general, when circuitry 109 is driving one or more further light emitting devices 105 and a respective paired light emitting device 103 under the same conditions, each of one or more further light emitting devices 105 and a respective paired light emitting device 103 emits light in a similar manner, and further experiences the same general operating conditions and/or general ambient conditions. Hence, in FIG. 3, light 222 emitted by a further light emitting devices 105 and light 232 emitted by a respective paired light emitting device 103 is similar, however travelling in different directions. In particular, light 222 is emitted towards light guide 111 and light 232 is emitted outwards from frame 113, for example as a pixel in an image being provided at array 101.

While only one of each of one or more further light emitting devices 105 and a respective paired light emitting device 103 is depicted as emitting respective light 222, 232, it is appreciated that: each light emitting device 103 can emit light as part of an image provided at array 101; and, each one or more further light emitting devices 105 is driven under the same conditions as a respective paired light emitting device 103 to emit light similar to light from a respective light emitting device 103. In other words, a each one or more further light emitting devices 105 is driven as a single pixel of the image provided at array 101, and further driven in the same manner as the respective paired light emitting device 103.

Hence, one or more further light emitting devices 105 are generally paired with a respective one of light emitting devices 103 of array 101, i.e. a respective paired light emitting device 103. In other words, circuitry 109 generally drives each one or more further light emitting device 105 under the same conditions as a respective paired light emitting device 103 of array 101, for example the same voltage and current characteristics.

Each one or more further light emitting device 105 is also a same type of device as a respective paired light emitting device 103 of array 101. Hence, as each one or more further light emitting device 105 is a same type of device as a respective paired light emitting device 103, and is driven under the same conditions as a respective paired light emitting device 103, and experiences the same operating conditions and/or ambient conditions, each one or more further light emitting device 105 ages in a similar manner as a respective paired light emitting device 103.

However, circuitry 109 is further configured to temporarily drive each of the one or more further light emitting devices 105 under different conditions as the respective paired light emitting devices 103 of array 101, for example to measure an optical characteristic at optical sensor 107, when each of the one or more further light emitting devices 105 is driven according a test pattern, as described hereafter.

Figure 4:
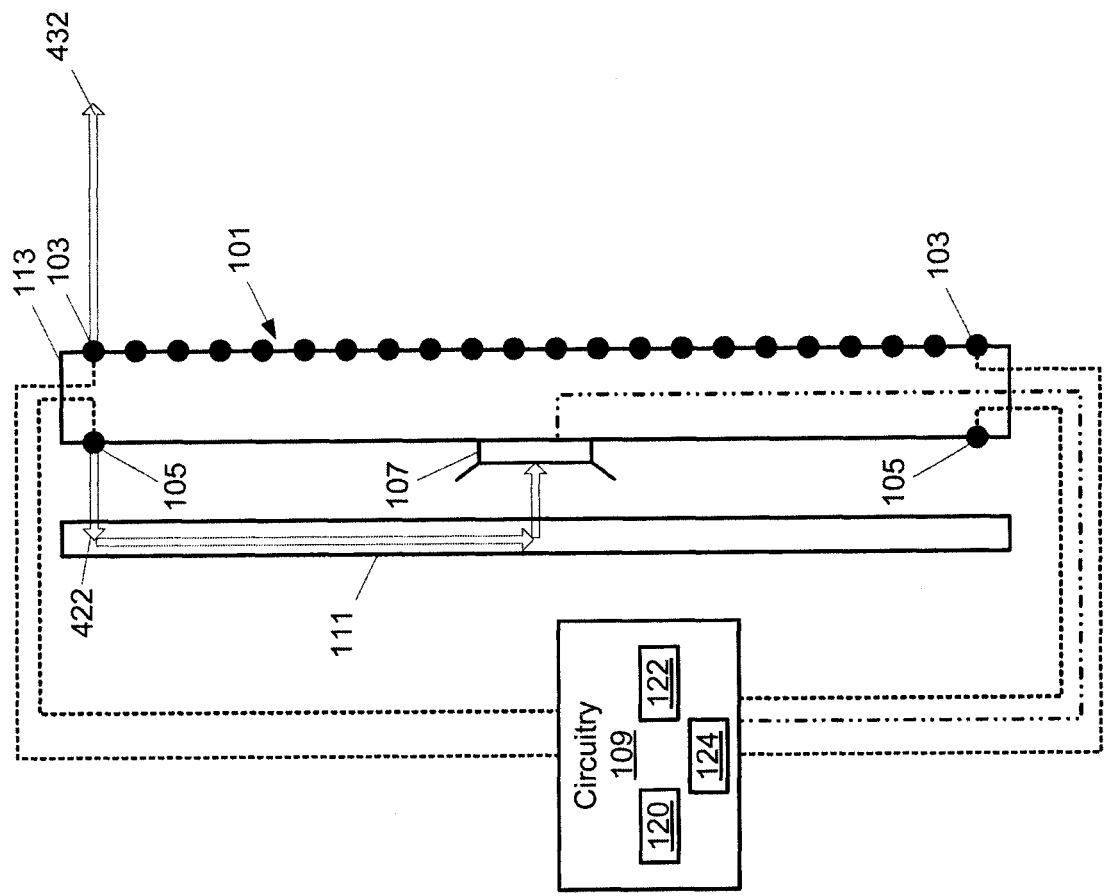
FIG. 4 depicts the device of FIG. 2 in operation with twinned light emitting devices being driven under different conditions than an array of light emitting devices, according to non-limiting implementations.

Attention is next directed to FIG. 4, which is substantially similar to FIGS. 2 and 3, with like elements having like numbers. However, in contrast to FIG. 3, in FIG. 4, circuitry 109 is temporarily driving one or more further light emitting devices 105 at conditions different from a respective paired light emitting device 103. Hence, light 422 emitted from one or more further light emitting devices 105 is different from light 432 emitted from a respective paired light emitting devices 103.

For example, circuitry 109 can be further configured to drive one or more further light emitting devices 105 in a test pattern when temporarily driving each of the one or more further light emitting devices 105 under the different conditions from the respective paired light emitting devices 103 of array 101. Specifically, circuitry 109 continues to drive array 101 of light emitting devices 103 to provide the image without interruption while simultaneously, and temporarily, driving one or more further light emitting devices 105 according to different conditions, such as a test pattern. Hence, tests can be performed on one or more further light emitting devices 105 without interrupting array 101.

In specific non-limiting implementations, circuitry 109 is further configured to drive the one or more further light emitting devices 105 in the test pattern by controlling one or more further light emitting devices 105 to emit one or more of white light, light in a grey scale, red light, green light and blue light. Hence, the optical characteristic measured by optical sensor 107 can include, but is not limited to one or more of a color, a colour coordinate, a white point, a brightness, and an intensify of one or more further light emitting devices 105. Circuitry 109 can be further configured to periodically drive the one or more further light emitting devices in the test pattern, for example, once a minute, once an hour, once a minute, and/or on-demand.

The test pattern can comprise simultaneously driving all of one or more further light emitting devices 105 in a same pattern: for example all of one or more further light emitting devices 105 can be controlled to simultaneously emit one or more of white light, light in a grey scale, red light, green light and blue light. The one or more of white light, light in a grey scale, red light, green light and blue light simultaneously emitted by one or more further light emitting devices 105 is collected by optical sensor 107, and hence a signal and/or data produced by optical sensor 107 comprises an average of all of one or more further light emitting devices 105. An average a colour coordinate, an average white point and/or an average brightness and/or an average intensity of one or more further light emitting devices 105, and hence array 101, can then be determined.

Alternatively, the test pattern can comprise simultaneously driving all of one or more further light emitting devices 105 to sequentially emit red, green and blue light (in any order): for example all of one or more further light emitting devices 105 can be controlled to simultaneously emit red light, then green light, and then blue light. The red light, green light, and blue light sequentially emitted by one or more further light emitting devices 105 is collected by optical sensor 107, and hence a signal and/or data produced by optical sensor 107 comprises average red light, average green light and average blue light of all of one or more further light emitting devices 105. An average red point, and average green point, and an average blue point (and/or an average brightness of each) of one or more further light emitting devices 105, and hence array 101, can then be determined. Using such a test pattern a color space of array 101 can be determined, for example a CIE (International Commission on Illumination and/or Commission Internationale de L'Eclairage) color space.

Alternatively, the test pattern can comprise driving one or more further light emitting devices 105 in a sequence, for example one at a time, to emit one or more of white light, light in a grey scale, red light, green light and blue light. The one or more of white light, light in a grey scale, red light, green light and blue light is collected by optical sensor 107, and hence sequential signals and/or data produced by optical sensor 107 comprises a sequential measurement of individual colour coordinates and/or white points of one or more further light emitting devices 105; in this manner, depending on how many further one or more further light emitting devices 105, image burn-in at array 101 can be detected. For example, presuming that about 1 in 10 of light emitting devices 103 in array 101 is paired with a further light emitting device 105, and that that the distribution of paired light emitting devices 103 is about evenly distributed across array 101, image burn-in can be detected. For example, a colour coordinates, white points and/or brightness and/or intensity can be compared across one or more further light emitting devices 105 and, when difference there between is above a threshold difference, it can be determined that image burn-in is occurring and/or that the one or more further light emitting devices 105 are degrading and/or changing differently.

Alternatively, the test pattern can comprise sequentially driving all of one or more further light emitting devices 105 to sequentially emit red, green and blue light (in any order): for example one or more further light emitting devices 105 can be controlled to sequentially emit red light, then green light, and then blue light. The red light, green light, and blue light sequentially emitted by one or more further light emitting devices 105 is collected, in sequence, by optical sensor 107, and hence a signal and/or data produced by optical sensor 107 comprises red light, average green light and average blue light of each of one or more further light emitting devices 105. Respective red points, green points, and blue points (and/or an average brightness of each) of each one or more further light emitting devices 105, and hence respective paired light emitting devices 103 of array 101, can then be determined. Using such a test pattern a color space of one or more further light emitting devices 105, and hence respective paired light emitting devices 103 of array 101, can then be determined, for example a CIE color space. Such a test pattern can also be used to detect image burn-in and specifically image burn-in specific to red, green and/or blue component image burn-in.

In any event, once one or more optical characteristics of one or more further light emitting devices 105 is determined, circuitry 109 can then adjust driving of array 101 based on the optical characteristic measured by optical sensor 107. For example, circuitry 109 can communicate (using interface 124) the one or more optical characteristics measured by optical sensor 107 to an external computing device that is monitoring one or more optical characteristics of a plurality of devices similar to device 100, for example, light emitting tiles in a display wall. The computing device can determine one or more common optical characteristics for each of the light emitting tiles, for example one or more of a common brightness, a common intensity, a common a colour coordinate, a common white point, a common color space, and the like, and communicate the one or more common optical characteristics to each of the light emitting tiles, including device 100. Such implementations are described in more detail below with reference to FIGS. 8 and 9.

Hence, circuitry 109 can receive the one or more common optical characteristics and adjust driving of array 101 based thereupon, for example by changing driving voltages and/or driving currents of light emitting devices 103 in array. Whether array 101 has been successfully adjusted can be tested by again driving one or more further light emitting devices 105 in the test pattern and again measuring one or more optical characteristics thereof using optical sensor 107.

In some implementations, a temperature difference can occur between array 101 and one or more further light emitting devices 105; as aging of some light emitting devices can be temperature dependent, in some implementations temperature sensors can further be incorporated into device 100. In some implementations, device 100 can hence further comprise cooling apparatus (e.g. cooling fans and the like), for cooling one or more further light emitting devices 105 to a temperature similar to array 101.

However, in other implementations, one or more temperature sensors can be used to determine a temperature difference between array 101 and one or more further light emitting devices 105.

Figure 5:
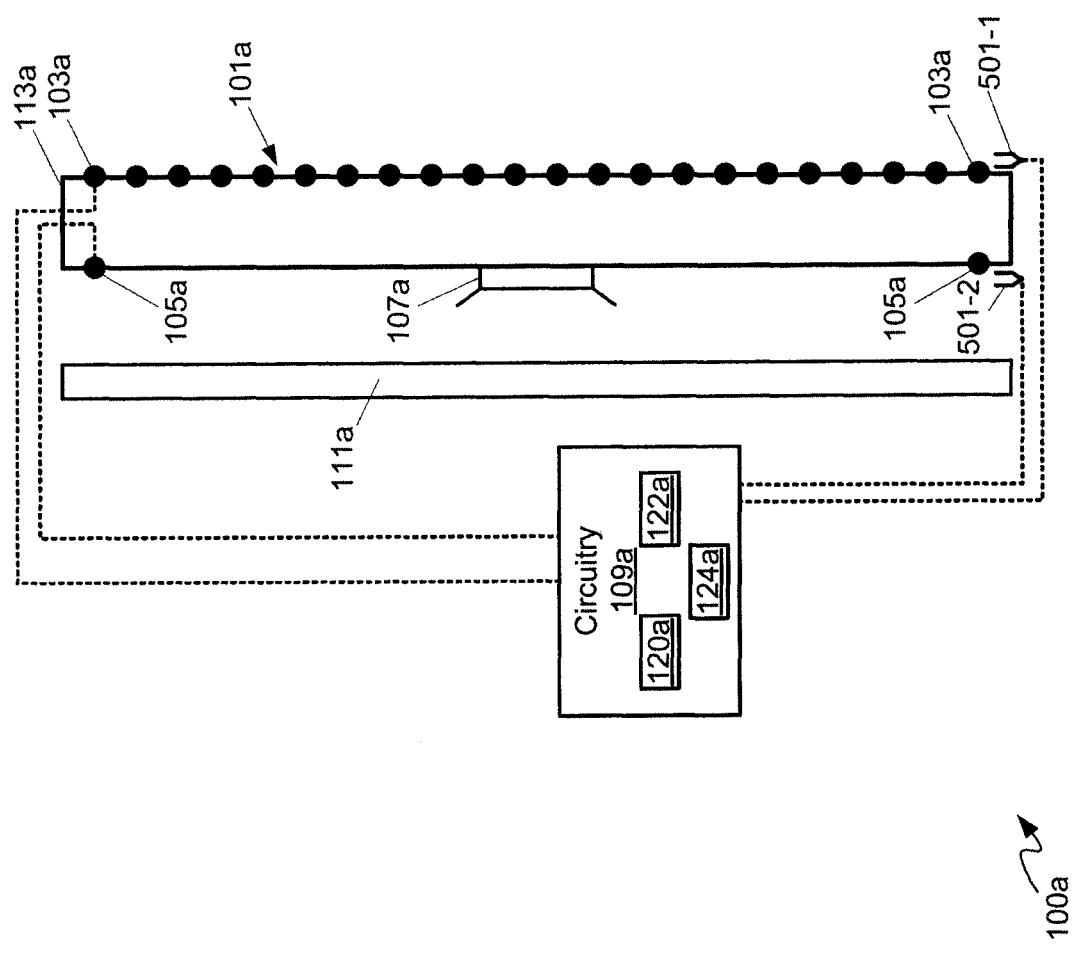
FIG. 5 depicts a schematic side view of the device of FIG. 1, according to alternative non-limiting implementations.

For example, attention is next directed. FIG. 5 which is substantially similar to FIG. 2, with like elements having like numbers, but with an "a" appended thereto. Hence, device 100a comprises an array 101a of light emitting devices 103a, one or more further light emitting devices 105a, an optical sensor 107a, circuitry 109a, a light guide 111a, and a frame 113a. Circuitry 109a comprises a processor 120a, a memory 122a and a communication interface 124a. For clarity, links between circuitry 109a, one light emitting device 103a and one further light emitting device 105a and are indicated via broken lines, however it is appreciated that circuitry 109a is in also in communication with all light emitting devices 103a of array 101a and all one or more further light emitting devices 105a. In these implementations, however, device 100a further comprise at least one temperature sensor 501-1, 501-2 configured to measure a temperature difference between array 101a and one or more further light emitting devices 105a, wherein adjusting driving of array 101a is further based on the temperature difference.

For example, as depicted, device 100a comprises: a first temperature sensor 501-1 located proximal and/or adjacent array 101a; and a second temperature sensor 501-2 located proximal and/or adjacent one or more further light emitting devices 105a. Temperature sensors 501-1, 501-2 will be interchangeably referred to hereafter, collectively, as temperature sensors 501 and, generically, as a temperature sensor 501.

Each temperature sensor 501 can comprise one or more of a thermocouple, a thermistor, a thermometer and the like. Further, while output from each temperature sensor 501 is described herein with respect to temperature, such output can be represented in terms of signals and/or data that is proportional to temperature. For example, each temperature sensor 501 can be configured to output a value to circuitry 109a that corresponds to a given temperature, for example on a scale of 0 to 255, and/or as a variable current, but that need not directly represent temperature in a given units system, such as degrees Celsius, and the like.

Temperature sensor 501-1 is generally configured to measure a temperature proximal and/or adjacent array 101a, and temperature sensor 501-2 is generally configured to measure a temperature proximal and/or adjacent one or more further light emitting devices 105a. Hence, for example, temperature sensor 501-1 can be located at an external surface of frame 113a proximal and/or adjacent array 101a, and temperature sensor 501-2 can be located at an internal surface of frame 113a proximal and/or adjacent one or more further light emitting devices 105a. In some implementations, temperature sensor 501-2 is located in a space defined by light guide 111a and an internal surface of frame 113a.

In any event, as one or more further light emitting devices 105a can be located in a confined space and/or on a separate substrate from array 101, a temperature of one or more further light emitting devices 105a can be different than a respective temperature of array 101a, and hence one or more further light emitting devices 105a can age differently than light emitting devices 103a at array 101a. For example a temperature of one or more light emitting devices 105a can be higher or lower than light emitting devices 103a at array 101. However, general aging behaviours aging of light emitting devices 103a, 105a at different temperatures can be pre-determined and hence, when a temperature difference between one or more further light emitting devices 105a and light emitting devices 103a is determined, and the aging behaviour is pre-determined, aging of light emitting devices 103a can be determined from one or more optical characteristics of one or more further light emitting devices 105a.

Figure 6:
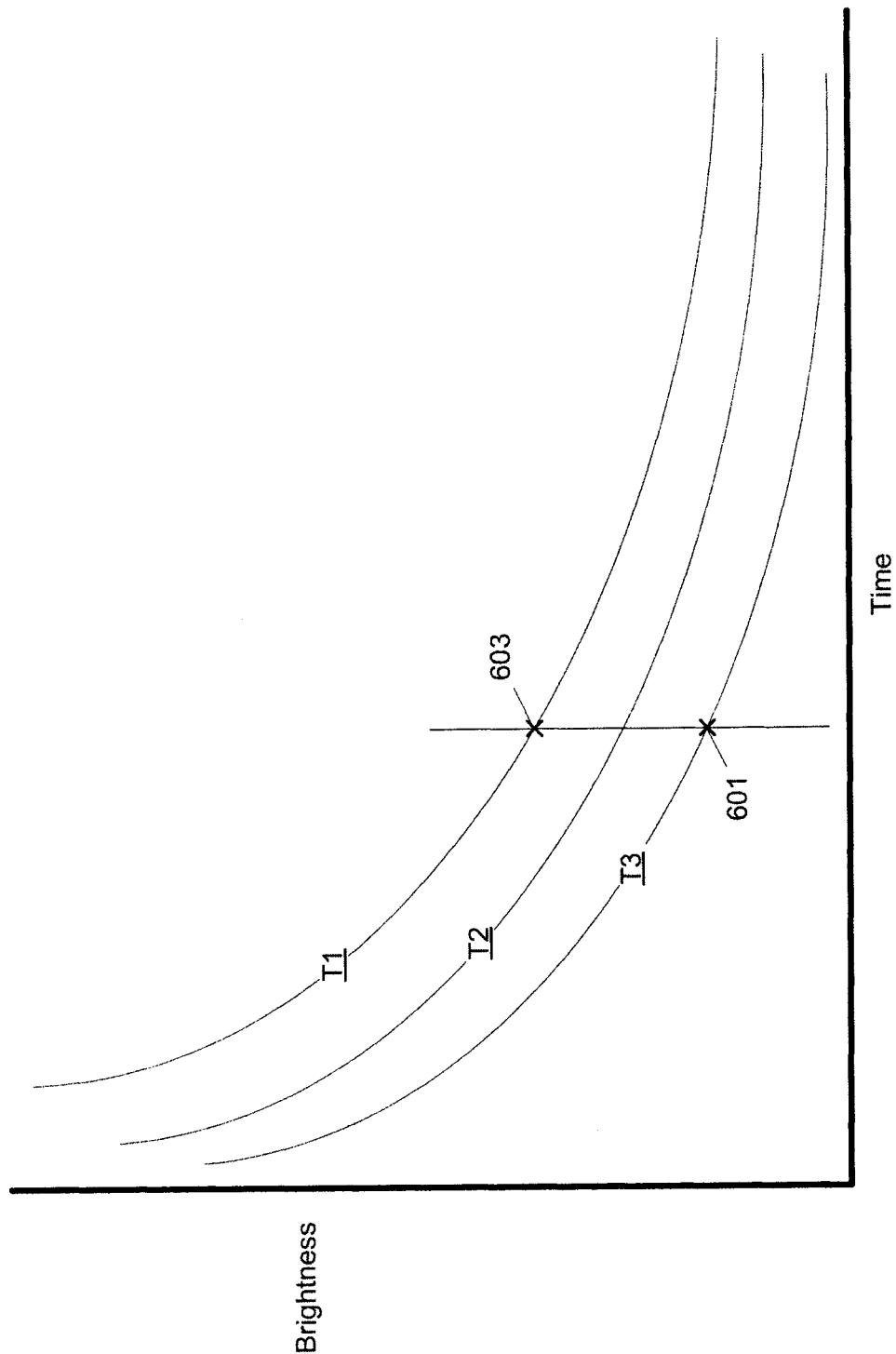
FIG. 6 depicts example brightness vs. aging curves of light emitting devices at different temperatures, according to non-limiting implementations.

For example, attention is next directed to FIG. 6 which depicts pre-determined relative brightness aging characteristics of LEDs at three different temperatures, T1, T2, and T3, where T1<T2 and T2<T3. Specifically each curve in FIG. 6 depicts brightness (brightness axis) as a function of time (time axis) for LEDs at temperatures T1, T2, T3. Hence, when a brightness 601 of one or more further light emitting devices 105a is determined at temperature T3, and array 101a is determined to be at temperature T1, then the corresponding brightness of a respective paired light emitting device 103a will be brightness 603, or along a line parallel to the brightness axis. Hence, a temperature based correction factor can be applied to brightness 601 to derive brightness 603 there from.

Further, while FIG. 6 shows relative brightness aging characteristics of LEDs, similar data for other optical characteristics and/or other types of light emitting devices can be determined. For example aging characteristics of light emitting devices 103a, 105a can be determined at a factory and/or during manufacture.

In any event, data corresponding to the curves of FIG. 6, and the like, can be stored at one or more of memory 122a of circuitry 109a and a memory of a computing device in communication with device 100a, so that a correction factor can be applied to one or more optical characteristics measured by optical sensor 107a to determine one or more optical characteristics of array 101.

Heretofore, implementations have been discussed in which an optical sensor is used to detect an optical characteristic of further light emitting devices 105, 105a. However, in other implementations, an electrical sensor can be used to detect an electrical characteristic of further light emitting devices.

Figure 10:
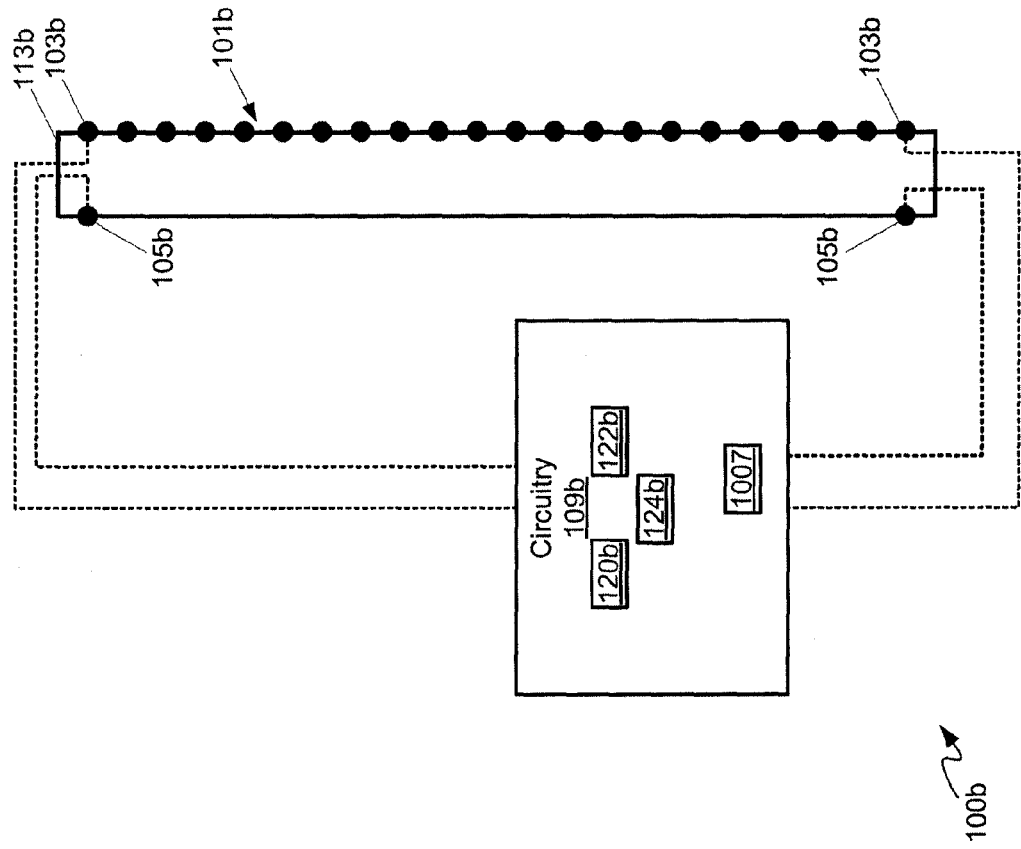
FIG. 10 depicts a schematic side view of the device of FIG. 1, according to alternative non-limiting implementations.

For example, attention is now directed to FIG. 10, which is substantially similar to FIG. 2, with like elements having like numbers, however with a "b" appended thereto. Hence, FIG. 10 depicts a device 100b comprises an array 101b of light emitting devices 103b, one or more further light emitting devices 105b, circuitry 109b, and a frame 113b. Circuitry 109b comprises a processor 120b, a memory 122b and a communication interface 124b. For clarity, two links between circuitry 109b, light emitting devices 103b and further light emitting device 105b are indicated via broken lines, however it is appreciated that circuitry 109b is in also in communication with all light emitting devices 103b of array 101b and all one or more further light emitting devices 105b. In contrast to devices 100, 100a, however, device 100b comprises an electrical sensor 1007.

Hence, FIG. 10 depicts a side schematic view of a device 100b comprising a light emitting tile which can be arranged in an array of other light emitting tiles to form a display wall. Specifically, device 100b comprises: an array 101b of light emitting devices 103b (only two of which are indicated in FIG. 10); one or more further light emitting devices 105b paired with respective light emitting devices 103b of the array 101b; an electrical sensor 1007 configured to detect one or more electrical characteristics of one or more further light emitting devices 105b; and, circuitry 109b configured to: drive array 101b of light emitting devices 103b; drive each of the one or more further light emitting devices 105b under same conditions as respective paired light emitting devices 105*b* of array 101*b*; temporarily drive each of one or more further light emitting devices 105 under different conditions as respective paired light emitting devices 103*b* of array 101*b*; and, adjust driving of array 101*b* of light emitting devices 103*b* based on the electrical characteristic of one or more further light emitting devices 105 detected at optical sensor 107 when one or more further light emitting devices 105 are driven under the different conditions.

In contrast to device 100, device 100*b* does not include an optical sensor and a light guide. Rather circuitry 109*b* comprises electrical sensor 1007. Alternatively, electrical sensor 1007 can be located external to circuitry 109*b*, though, in such implementations, electrical sensor 1007 is in communication with circuitry 109*b*.

Electrical sensor 1007 can comprise an analog to digital converter (ADC) configured to measure one or more of an operating power, an operating voltage, and an operating current, particularly when circuitry 109*b* is driving one or more further light emitting devices 109*b* differently from array 101*b*. Further, while output from electrical sensor 1007 is described herein with respect to one or more electrical characteristics, such output can be represented in terms of signals and/or data that is proportional to one or more optical characteristics. For example, electrical sensor 1007 can be configured to output a value to circuitry 109*b* that corresponds to measured power (and/or a measured voltage and/or a measured current), for example on a scale of 0 to 255 (and the like, and/or higher or lower than 255), that need not directly represent an electrical characteristic in a given units systems, such as Watts, Volts, Amps, and the like.

In these implementations, circuitry 109*b* can temporarily drive further light emitting devices 105*b* according to a test pattern for example, a given operating voltage and/or a given operating current, and electrical sensor 1007 can measure the resulting operating power of one or more further light emitting devices 109*b*, either individually and/or in total.

For example, for the test pattern, circuitry 109*b* can drive each of the one or more further light emitting devices 105*b* according to the same operating voltage, and electrical sensor 1007 can measure the resulting operating current (and/or the resulting operating power); alternatively, for the test pattern, circuitry 109*b* can drive each of the one or more further light emitting devices 105*b* according to the same operating current, and electrical sensor 1007 can measure the resulting operating voltage (and/or the resulting operating power). Either way, power consumption of each of the one or more further light emitting devices 105*b* can be determined over time, and hence aging of each of the one or more further light emitting devices 105*b* can be tracked and/or determined using electrical characteristics of the one or more further light emitting devices 105*b*.

In other words, the operating power and/or operating voltage and/or operating current can change over time, as array 101*b* and one or more further light emitting devices 105*b* age; hence the change in operating power and/or operating voltage and/or operating current can provide an indication of the aging, which can be used to adjust driving of array 101*b*.

In some implementations, temperature corrections can be applied to the electrical characteristics, similar to the optical characteristics, as described above.

In any event, once one or more electrical characteristics of one or more further light emitting devices 105*b* is determined, circuitry 109*b* can then adjust driving of array 101*b* based on the optical characteristic measured by electrical sensor 1007. For example, circuitry 109*b* can communicate (using interface 124*b*) the one or more electrical characteristics measured by electrical sensor 1007 to an external computing device that is monitoring one or more electrical characteristics of a plurality of devices similar to device 100*b*, for example, light emitting tiles in a display wall. The computing device can determine one or more common electrical characteristics for each of the light emitting tiles, for example one or more of a common power, a common voltage and a common current, when each of the light emitting tiles are driven under similar conditions, and the like, and communicate the one or more common electrical characteristics to each of the light emitting tiles, including device 100. Such implementations are described in more detail below with reference to FIGS. 8 and 9.

In some implementations, device 100, device 100*a* and/or device 100*b* can include both an optical sensor and an electrical sensor. Hence, display tiles and/or light emitting tiles described herein can include one or more sensors configured to detect one or more of an optical characteristic and an electrical characteristic of one or more further light emitting devices which are paired and/or twinned with light emitting devices of an array.

Figure 7:
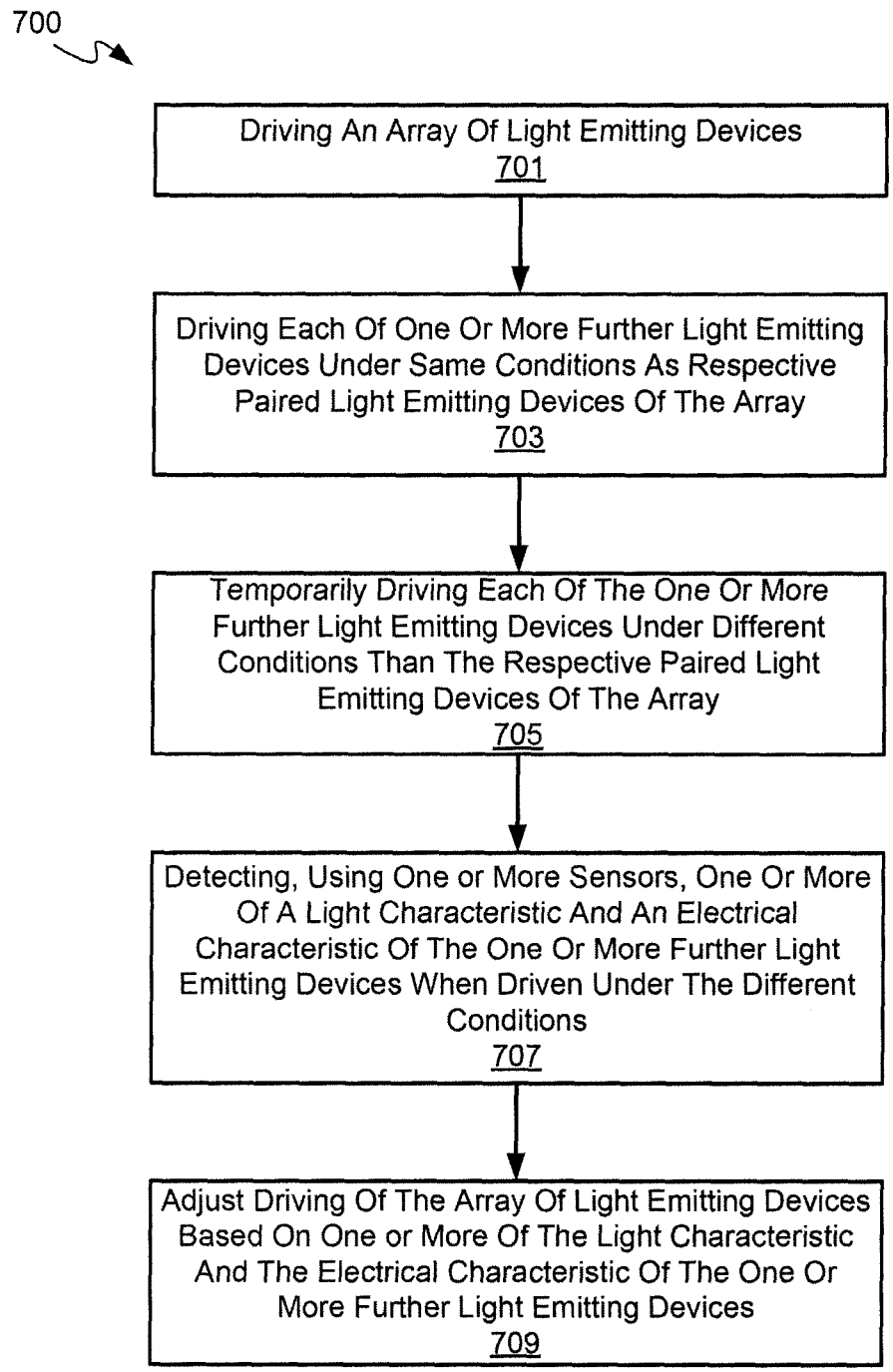
FIG. 7 depicts a method for dynamically monitoring and calibrating display tiles and/or light emitting tiles, according to non-limiting implementations.

Attention is now directed to FIG. 7 which depicts a flowchart illustrating a method 700 for dynamically monitoring and calibrating display tiles and/or light emitting tiles, according to non-limiting implementations. In order to assist in the explanation of method 700, it will be assumed that method 700 is performed using device 100. Furthermore, the following discussion of method 700 will lead to a further understanding of device 100 and its various components. However, it is to be understood that device 100 and/or method 700 can be varied, and need not work exactly as discussed herein in conjunction with each other, and that such variations are within the scope of present implementations. It is appreciated that, in some implementations, method 700 is implemented in device 100 by circuitry 109 and/or processor 120. For example, circuitry 109 can store an application in memory 122 comprising instructions for implementing method 700.

It is to be emphasized, however, that method 700 need not be performed in the exact sequence as shown, unless otherwise indicated; and likewise various blocks may be performed in parallel rather than in sequence; hence the elements of method 700 are referred to herein as "blocks" rather than "steps". It is also to be understood that method 700 can be implemented on variations of device 100 as well, including, but not limited to, device 100*a*, and device 100*b*. It is further assumed in the following discussion that device 100 can comprise an electrical sensor similar to electrical sensor 1007.

At blocks 701 and blocks 703, circuitry 109 drives array 101 of light emitting devices 103, and drives each of one or more further light emitting devices 105 under same conditions as respective paired light emitting devices 103 of array 101, as described above. Blocks 701 and 703 are generally performed in parallel with each other so that one or more further light emitting devices 105 and respective paired light emitting devices 103 age in the same manner.

At block 705, circuitry 109 temporarily drives each of one or more further light emitting devices 105 under different conditions than respective paired light emitting devices 103 of array 101, for example by periodically controlling one or more further light emitting devices 105 to provide a test pattern, either simultaneously or sequentially, as described above. While block 705 is occurring, circuitry continues to drive array 101 under the same conditions of blocks 701, 703. Hence, while the test pattern, and the like, is being provided at one or more further light emitting devices 105, images continue to be provided at array 101 without interruption.

At block 707 one or more of an optical characteristic and an electrical characteristic of one or more further light emitting devices 105 is detected using a sensor, for example optical sensor 107 and/or an electrical sensor similar to electrical sensor 1007, when one or more further light emitting devices 105 are driven under the different conditions of block 707. It is appreciated that blocks 705, 707 are performed in parallel so that circuitry 109 temporally drives one or more further light emitting devices 105, for example, in the test pattern, while receiving a signal representative of one or more optical characteristics of one or more further light emitting devices 105.

At block 709, circuitry 109 adjusts driving of array 101 of light emitting devices 103 based on one or more of the optical characteristic and the electrical characteristic of one or more further light emitting devices 105. Block 709 can include, but is not limited to, communicating the one or more of the optical characteristic and the electrical characteristic detected at block 707 to a computing device, and receiving, from the computing device, data for adjusting driving of array 101 of light emitting devices 105 based on one or more of the optical characteristic and the electrical characteristic of one or more further light emitting devices 105. In other words, the computing device can determine a brightness and/or an intensity, and/or a colour coordinate, and/or a white point and/or a color space, and/or an operating power and/or an operating voltage and/or an operating current and the like, at which array 101 is to operate, at least under given conditions (e.g. similar electrical conditions) and communicate such operating conditions and/or one or more of the optical characteristic and the electrical characteristic to circuitry 109 so that circuitry 109 can adjust driving of array 101.

In some implementations, block 709 can be optional when an adjustment to array 101 is not performed, for example when the one or more of the optical characteristic and the electrical characteristic of one or more further light emitting devices 105 are indicative of array 101 operating within given operating conditions.

Figure 8:
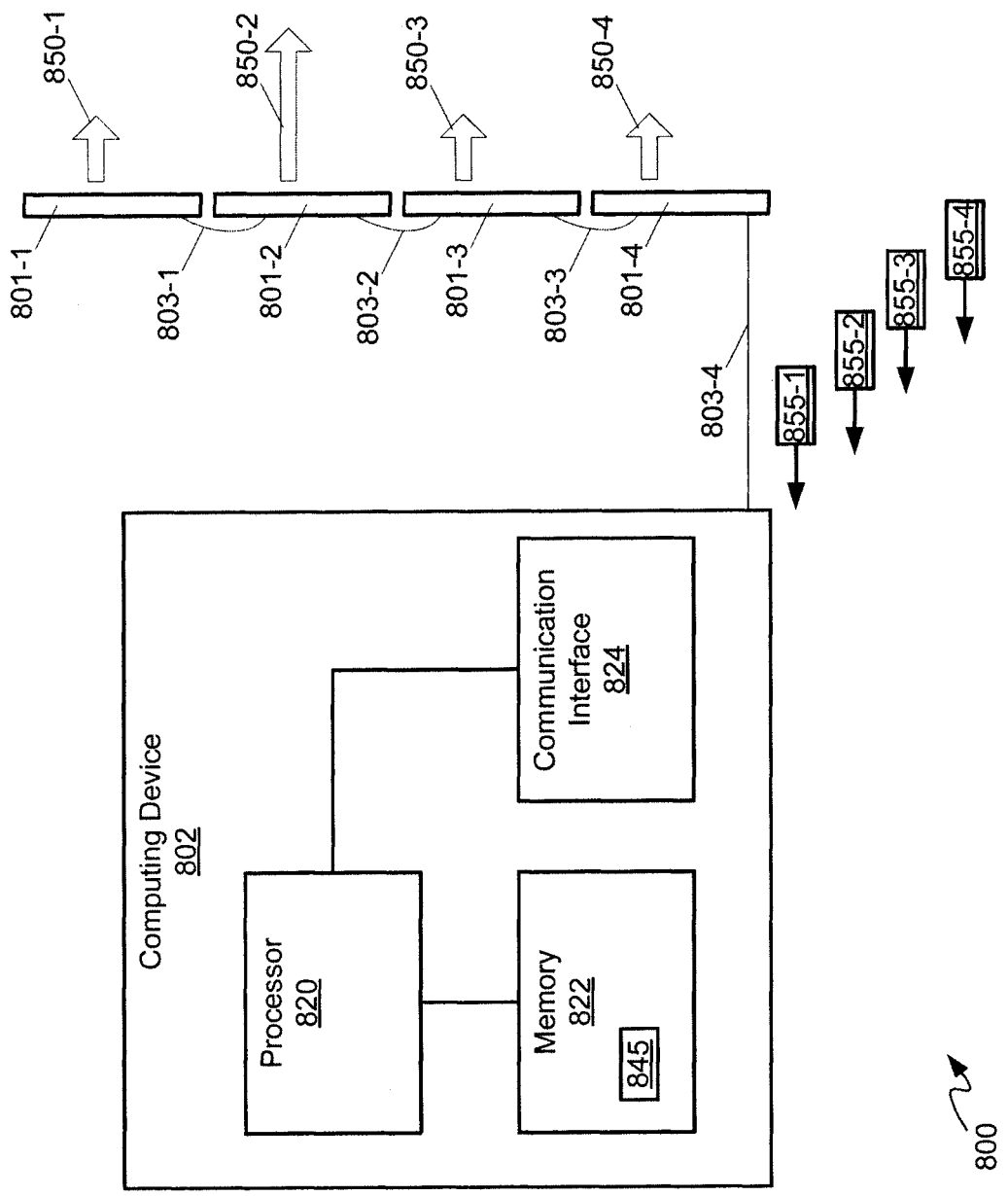
FIG. 8 depicts a system of display tiles implementing the method of FIG. 7, according to non-limiting implementations.

Attention is next directed to FIG. 8, which schematically depicts a system comprising: a plurality of light emitting tiles 801-1, 801-2, 801-3, 801-4, and at least one computing device 802 in communication with plurality of light emitting tiles 801-1, 801-2, 801-3, 801-4, for example via links 803-1, 803-2, 803-3, and 803-4. Plurality of light emitting tiles 801-1, 801-2, 801-3, 801-4 will be interchangeably referred to hereafter, collectively, as light emitting tiles 801 and, generically, as a light emitting tiles 801. Links 803-1, 803-2, 803-3, 803-4 will be interchangeably referred to hereafter, collectively, as links 803 and, generically, as a link 803.

Each light emitting tile 801 is similar one or more of device 100, device 100a and device 100b and hence, each light emitting tile 801 comprises: an array of light emitting devices; one or more further light emitting devices paired with respective light emitting devices of the array; a sensor configured to detect one or more of an optical characteristic and an electrical characteristic of the one or more further light emitting devices; and, circuitry configured to: drive the array of light emitting devices; drive each of the one or more further light emitting devices under same conditions as respective paired light emitting devices of the array; and, temporarily drive each of the one or more further light emitting devices under different conditions as the respective paired light emitting devices of the array.

Each link 803 can comprise any combination of wired and/or wireless links. Further, while links 803 as depicted show light emitting tiles 801 and computing device 802 connected in series, in other implementations, light emitting tiles 801 can be connected in parallel to computing device 802. In general, however, links 803 comprise a computer bus over which computing device 802 communicates with light emitting tiles 801.

Computing device 802 is generally configured to provide an image, including but not limited to a plurality of images, video and the like, to light emitting tiles 801; each light emitting tile 801 is configured to provide, at a respective array of light emitting devices, similar to array 101, a portion of the image. Hence, light emitting tiles 801 comprise one or more of a display wall, a video wall and the like. However, in other implementations the system of FIG. 8 can further include a "Sender Unit" configured to receive a video signal (for example an video signal from a computer could be an input), and one or more "Receiver Units" in communication with the "Sender Unit"; the one or more "Receiver Units" would be responsible for distributing an appropriate portion of a video signal to each of light emitting tiles 801; such "Receiver Units" could also manage the colour correction described hereafter. Computing device 802 can comprise a receiver unit.

Further, while four light emitting tiles 801 are depicted from a side view, and stacked one on top of each other, system 800 can comprise any number of light emitting tiles 801 in any configuration.

Computing device 802 generally comprises a processor 820 interconnected with a memory 822 and a communication interface 824. Processor 820 can be implemented as a plurality of processors, including but not limited to one or more central processors (CPUs) and/or a plurality of transistors. Processor 820 is configured to communicate with a memory 822 comprising a non-volatile storage unit (e.g. Erasable Electronic Programmable Read Only Memory ("EEPROM"), Flash Memory, and the like) and a volatile storage unit (e.g. random access memory ("RAM"), and the like). Programming instructions that implement the functional teachings of computing device 802 as described herein are typically maintained, persistently, in memory 822 and used by processor 820 which makes appropriate utilization of volatile storage during the execution of such programming instructions. In some implementations, processor 820 comprises at least a portion of memory 822, for example as on-board random access memory (RAM). It is further appreciated that memory 822 is an example of computer readable media that can store programming instructions executable on processor 820. Furthermore, memory 822 is also an example of a memory unit and/or memory module.

In particular, it is appreciated that memory 822 stores application 845, that, when processed by processor 820, enables processor 820 and/or computing device 802 to: receive, from respective optical sensors of each of the plurality of light emitting tiles 801, respective one or more of a respective optical characteristic and a respective electrical characteristic of respective one or more further light emitting devices when respectively driven under respective different conditions; determine one or more of a common optical characteristic and a common electrical characteristic from one or more of the respective optical characteristic and the respective electrical characteristic; and, communicate the one or more of the common optical characteristic and the common electrical characteristic to the plurality of light emitting tiles 801 so that respective circuitry can drive each respective array according to one or more of the common optical characteristic and the common electrical characteristic. For example, the common characteristic can comprise a common a colour coordinate, a common white point, a common color space, a common brightness, a common intensity, a common operating power, a common operating voltage and a common operating current.

Further, application 845 is an example of programming instructions executable on processor 820 and/or computer-readable program code for operation of computing device 802.

Processor 820 also connects to communication interface 824 (interchangeably referred to interchangeably as interface 824), which can be implemented as one or more radios and/or connectors and/or network adaptors, configured to communicate with light emitting tiles 801. It will be appreciated that interface 824 is configured to correspond with network architecture that is used to implement links 803 to the one or more communication networks, including but not limited to any suitable combination of USB (universal serial bus) cables, serial cables, wireless links, Bluetooth links, NFC (near field communication) links, WLAN (wireless local area network) links, WiFi links and the like, and/or a combination.

FIG. 8 also depicts a respective optical characteristic 850-1, 850-2, 850-3, 850-4 of each light emitting tile 801. Respective optical characteristics 850-1, 850-2, 850-3, 850-4 will be interchangeably referred to hereafter, collectively, as optical characteristics 850 and, generically, as a optical characteristic 850. For example, each optical characteristic 850 can comprises one or more of a respective brightness, a respective intensity, a respective colour coordinate, a respective white point, and a respective color space of each light emitting tile 801, for example as emitted as part of a respective portion of an image being provided at light emitting tiles 801. However, each optical characteristic 850 can also correspond to an electrical characteristic, for example, an operating power when driven under given conditions, such as a given voltage or a given current.

As depicted, each of optical characteristics 850-1, 850-3, 850-4 are similar to one another, while optical characteristic 850-2 is different from optical characteristics 850-1, 850-3, 850-4 (i.e. light emitting tile 801-2 is brighter or dimmer than light emitting tiles 801-1, 801-3, 801-4, and/or light emitting tile 801-2 has a different colour coordinate, a different white point and/or a different color space than light emitting tiles 801-1, 801-3, 801-4).

In some implementations, each light emitting tile 801 can periodically communicate respective data 855-1, 855-2, 855-3, 855-4 over links 803 to computing device 802. Data 855-1, 855-2, 855-3, 855-4 will be interchangeably referred to hereafter, collectively, as data 855 and, generically, as data 855. Computing device 802 can periodically poll and/or query each light emitting tiles 801 for respective data 855, and/or each light emitting tile 801 can periodically transmit respective data 855 to computing device 802.

Regardless, prior to communicating data 855, each light emitting tile 801 performs a measurement of respective optical characteristic and/or a respective electrical characteristic of respective further light emitting devices using one or more respective sensors (e.g. similar to optical sensor 107 and/or electrical sensor 1007) without interrupting providing a respective portion of an image at a respective array of light emitting devices, as described above. In other words, blocks 701-707 of method 700 are implemented at each light emitting tile 801.

Each set of data 855 comprises data indicative of one or more of an optical characteristic and an electrical of respective further light emitting devices, for example data representative of a respective brightness, a respective intensity, a respective colour coordinate, a respective white point, a respective color space, a respective power, a respective current and/or a respective current, as described above.

Hence, computing device 802 receives, from respective optical sensors (e.g. optical sensor 107) of each of plurality of light emitting tiles 801, one or more of a respective optical characteristic and a respective electrical characteristic of respective one or more further light emitting devices (e.g. further light emitting devices 105) when respectively driven under respective different conditions from respective arrays of light emitting devices. In implementations where temperature correction factors are used, as described above with respect to FIGS. 5 and 6, data 855 can reflect such a correction factor and/or such a correction factor can be applied at computing device 802.

Computing device 802 can then compare data 855 with one another, and/or with desired operating conditions of light emitting tiles 801 stored at memory 822, and determine one or more of a common optical characteristic and a common electrical characteristic of the respective optical characteristics represented by data 855. For example, presuming that data 855-2 is representative of light emitting tile 801-2 being brighter than light emitting tiles 801-1, 801-3, 801-4, computing device 802 can determine that brightness of light emitting tile 801-2 is to be reduced to match at least neighbouring light emitting tiles 801-1, 801-3, and/or that an electrical characteristic of light emitting tile 801-2 is to be changed to reduce the brightness of light emitting tile 801-1. In this instance, the common optical characteristic comprises a brightness to which all light emitting tiles 801 are to be controlled and/or the common electrical characteristic comprises a power, and the like, to which all light emitting tiles 801 are to be controlled so that the brightness of all light emitting tiles 801 are similar. Alternatively, the common optical characteristic comprises a white point to which all light emitting tiles 801 are to be controlled. Alternatively, the common optical characteristic comprises a colour coordinate to which all light emitting tiles 801 are to be controlled. In yet a further alternative, the common optical characteristic comprises a color space to which all light emitting tiles 801 are to be controlled. The common electrical characteristic can hence correspond to a power, and the like, that corresponds to a colour coordinate, a white point and/or a color space to which all light emitting tiles 801 are to be controlled In yet further implementations, the common optical characteristic comprises an optical characteristic that is within a given range and/or an electrical characteristic that is within a given range. For example, when the common optical characteristic comprises a common colour coordinate, a common white point and/or brightness (and/or the common electrical characteristic corresponds to such), each respective colour coordinate and/or white point and/or brightness of each respective light emitting tile 801 can be controlled to within a given difference of one another: for example a target color difference could be about 0.003 $\Delta U'V'$, and a target intensity difference could be less than about 3%.

Computing device 802 then communicates the common optical characteristic and/or the common electrical characteristic to one or more of plurality of light emitting tiles 801 so that respective circuitry (similar to circuitry 109) can drive each respective array according to the common optical characteristic and/or the common electrical characteristic. When the common electrical characteristic is used, the common electrical characteristic can comprise a power, and the like, to which each respective array is to be driven under given conditions. The common electrical characteristic can also be represented in terms of one or more scaling factors for increasing or decreasing power of respective arrays to provide brightness matching, color matching, colour coordinate matching, white point matching, and the like between light emitting tiles 801.

Figure 9:
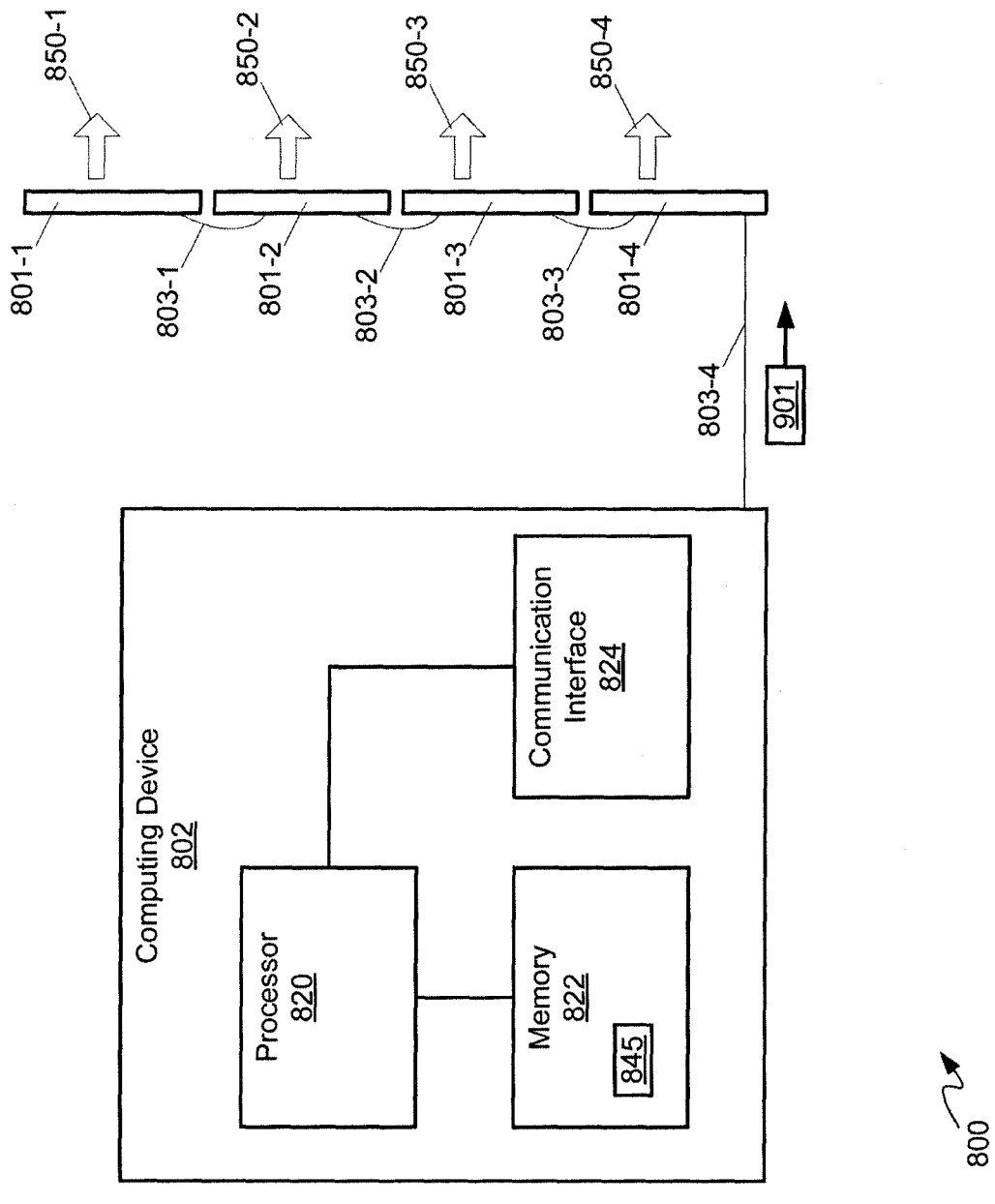
FIG. 9 depicts the system of FIG. 8 after a brightness of one of the display tiles is adjusted without interrupting an image displayed thereupon, according to non-limiting implementations.

For example, as depicted in FIG. 9, which is substantially similar to FIG. 8, with like elements having like numbers, computing device 802 transmits data 901 to at least light emitting tile 801-2 to cause circuitry of light emitting tile 801-2 to reduce the brightness of the respective array. Hence, as depicted in FIG. 9, optical characteristic 850-2 now appears similar to optical characteristics 850-1, 850-3, 850-4. In other words, the brightness of light emitting tile 801-2 has been reduced to a brightness and/or intensity similar to the other light emitting tiles 801. Alternatively, a white point of one or more of light emitting tiles 801 can be changed so that each light emitting tile 801 has a similar white point. Alternatively, a colour coordinate of one or more of light emitting tiles 801 can be changed so that each light emitting tile 801 has a similar white point. Alternatively, a color space of one or more of light emitting tiles 801 can be changed so that each light emitting tile 801 has a similar color space.

Furthermore, such changing of optical characteristics and/or electrical characteristics of one or more of light emitting tiles 801 occurs without the use of external measurement equipment and/or without interrupting displaying an image at light emitting tiles 801.

In specific non-limiting implementations, device 100 comprises an LED wall tile in a display wall of LED wall tiles; for each LED wall tile, an additional set of "back-facet" LEDs (e.g. 1, 4, 9, 16, or 25 pcs) are added on the rear side of the tile, shining backward. Additionally, each LED receives the same drive stimulation as its "twin-LED" on the front of the panel, to ensure that the rear LED experiences the same driving and usage scenarios as the LEDs on the front side of the tile. Being on the rear then allows ample space for a light pipe/mixing device and appropriate optical detector/optical sensor to be installed that can sample the optical colour and intensity data characteristics of the LEDs, as their performance changes due to time (aging) and operating temperature. When a measurement occurs, the rear LEDs can be disconnected from the front LEDs to display an appropriate test pattern of the measurement algorithm and, once the measurement is completed, the rear LEDs can be reconnected to the main array. It is generally assumed that the rear LEDs are accurately reporting/mirroring the performance of the LEDs in the primary array on the front of the tile, since the rear LEDs can generally installed at a factory from the same bins, and hence were calibrated with the same precision, and experienced the identical drive content and ambient environmental conditions as the front LEDs.

In any event, once the measurement occurs, then neighbor-colour-matching algorithms can be used so produce a tightly matched display array (an example target color difference could be 0.003 AU'V' for colour, and <3% for intensity), even when a tile of unknown origin has been inserted into the display wall. This removes the requirement of having to treat an LED Wall purchase as an entire "screen" of a fixed number of tiles; instead each individual tile can be treated as a truly modular and discrete item. This enables the flexibility for LED walls to be created quickly with available components of varying age and history.

Hence, disclosed herein is a display tile (and/or a light emitting tile), in which optical characteristics and/or electrical characteristics can be monitored and changed without interrupting displaying of an image at the display tile. By providing one or more light emitting devices ("paired devices" and/or "twinned devices") which are paired with light emitting devices of an array of light emitting devices providing an image at the display tile, and by driving the one or more paired devices in a similar manner to the paired light emitting devices of the array, the one or more paired devices age in a manner similar to the light emitting devices of the array. Hence, it can be assumed that the optical characteristics and/or electrical characteristics of the one or more paired devices represent the optical characteristics and/or electrical characteristics of the array. Based on measurements of the one or more paired devices, the optical characteristics and/or electrical characteristics of the array can be adjusted, for example to match neighbouring display tiles.

Figure 11:
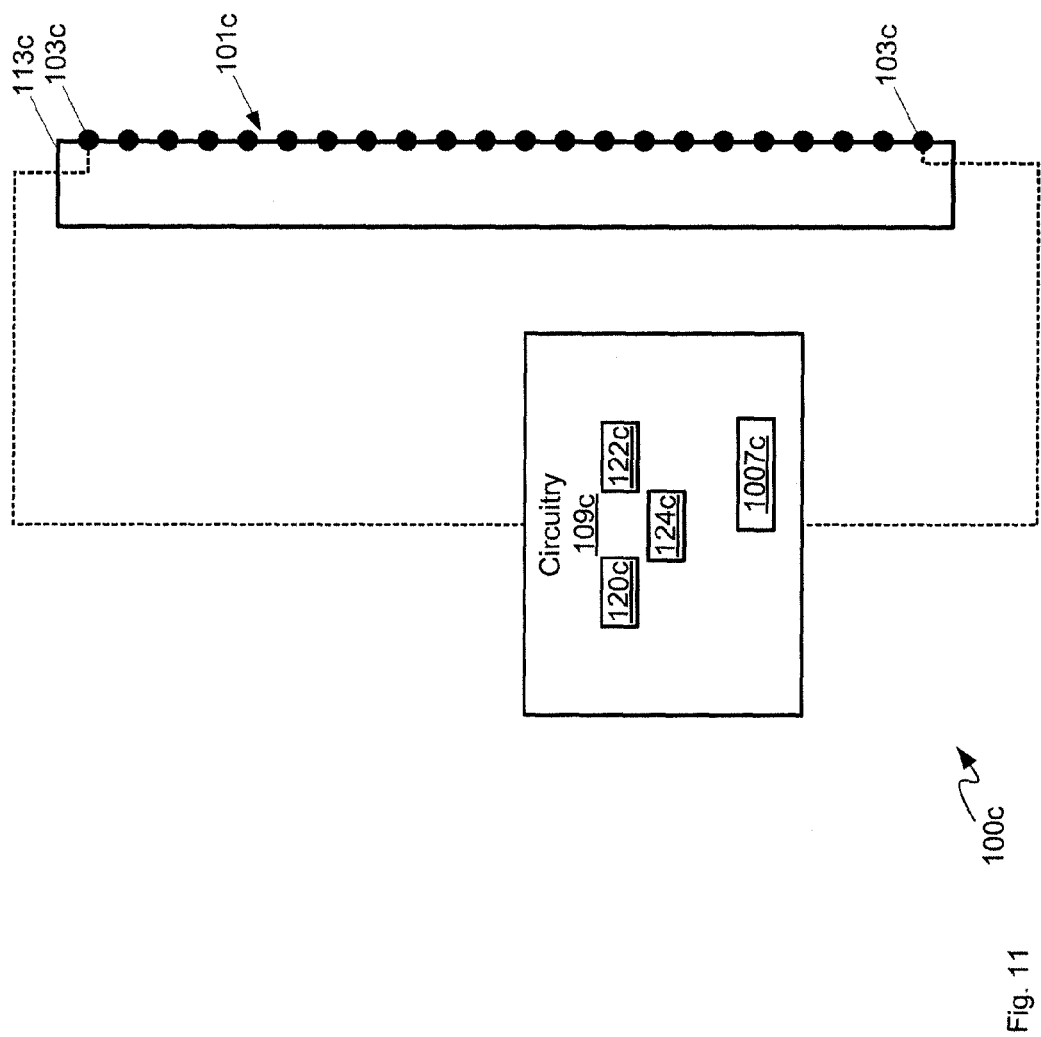
FIG. 11 depicts a schematic side view of the device of FIG. 1, according to alternative non-limiting implementations.

Attention is now directed to FIG. 11, which is substantially similar to FIG. 2, with like elements having like numbers, however with a "c" appended thereto. Hence, FIG. 11 depicts a device 100c comprises an array 101c of light emitting devices 103c, circuitry 109c, and a frame 113c. Circuitry 109c comprises a processor 120c, a memory 122c and a communication interface 124c. For clarity, links between circuitry 109c and two light emitting devices 103c are indicated via broken lines, however it is appreciated that circuitry 109c is in also in communication with all light emitting devices 103c of array 101c. In contrast to device 100, 100a, however, device 100b comprises an electrical sensor 1007c, similar to electrical sensor 1007. As depicted, device 100c does not include further light emitting devices, similar to further light emitting devices 105, and/or an optical sensor, similar to optical sensor 107; however, in other implementations, device 100c can further comprises light emitting devices, similar to further light emitting devices 105, and/or an optical sensor, similar to optical sensor 107 (and a light guide etc.).

Hence, FIG. 11 depicts a side schematic view of a device 100c comprising a light emitting tile which can be arranged in an array of other light emitting tiles to form a display wall. Device 100c can otherwise appear similar to device 100 of FIG. 1. Specifically, device 100c comprises: an array 101c of light emitting devices 103c; a sensor 1007c configured to detect an electrical characteristic of one or more of the light emitting devices 103c; and, circuitry 109c configured to: drive array 101c of light emitting devices 103c to provide an image; temporarily drive each of light emitting devices 103c to provide a test pattern; and, adjust driving of array 101c of light emitting devices 103c to provide the image based on the electrical characteristic of one or more light emitting devices 103c detected at sensor 1007c when one or more light emitting devices 103c are driven according to the test pattern.

In contrast to device 100, device 100c does not include an optical sensor and a light guide. Rather circuitry 109c comprises electrical sensor 1007c, for example, an ADC, similar to electrical sensor 1007. Alternatively, electrical sensor 1007c can be located external to circuitry 109c, though, in such implementations, electrical sensor 1007c is in communication with circuitry 109c.

Similar to implementations described above with reference to FIG. 10, circuitry 109c can be further configured to temporarily drive each of light emitting devices 103c to provide the test pattern by driving each of light emitting devices 103c to one or more of a given current and a given voltage. Hence, sensor 1007c can be further configured to one or more of: detect the electrical characteristic of one or more of light emitting devices 103c by measuring one or more of a resulting voltage and a resulting power, when each of light emitting devices 103c is driven to the given current; and, detect the electrical characteristic of one or more of light emitting devices 103c by measuring one or more of a resulting current and the resulting power, when each of light emitting devices 103c is driven to the given voltage.

In other words, sensor 1007c measures a power characteristic of each of light emitting devices 103c, under the test pattern conditions, so that aging of the light emitting devices 103c can be tracked over time. The test pattern can hence be run periodically in order to track individual aging of each of light emitting devices 103c, and driving array 101c can be adjusted based on the test pattern measurements, so that each of light emitting devices 103c are operating within given conditions. Hence, if one or more light emitting devices 103c are aging faster than others, driving of the one or more light emitting devices 103c can be adjusted when array 101c provides the image so that visual artifacts, due to light emitting devices 103c aging at different rates, can be reduced.

In some implementations, one or more of the given current and the given voltage is below a respective given current and a respective given voltage at which light emitting devices 103c emit light. In other implementations, one or more of the given current and the given voltage is above a respective given current and a respective given voltage at which light emitting devices 103c emit light. In other words, the test pattern can include light emitting devices 103c being driven to emit light or not emit light.

In some implementations, circuitry 109c is further configured to temporarily drive each of light emitting devices 103c to provide the test pattern by interrupting displaying of image and providing the test pattern. In other words, in these implementations, circuitry 109c temporarily stops driving array 101c to provide the image and, instead, temporarily provides the test pattern. In these implementations, the test pattern can include, but is not limited to, rastering through each light emitting device 103c by turning each light emitting device 103c on to a given power or a given voltage and then off, turning all light emitting devices 103c to a given power or a given voltage, and the like, so that sensor 1007c can measure power, and the like, at each light emitting device 103c.

However, in other implementations, circuitry 109c is further configured to temporarily drive each of light emitting devices 103c to provide the test pattern by individually and sequentially driving each of light emitting devices 103c to one or more of a given current and a given voltage while the image is being provided at the array 101c. In other words, each light emitting device 103c is individually and sequentially stopped from providing a portion of the image so that the test pattern can be provided at each light emitting device 103c, even as other light emitting devices 103c continue to provide the image around a light emitting device 103c upon which a test is currently being perforated. In other words, providing the image at array 101c is not interrupted, at any given time, except a light emitting device 103c where the test pattern is being provided. In the implementations, the test pattern is provided by driving each light emitting device 103c, one at a time, to a given current or a given voltage, so that the resulting power, or the like, can be measured by sensor 1007c.

In some of these implementations, the sequence in which each of light emitting devices 103c is driven comprises a raster pattern; in other words, circuitry can start in one corner of array 101c and raster through each light emitting device 103c.

However, such a regular pattern might also be eye catching to a viewer as each light emitting device 103c rasters through the test pattern. Hence, in alternative implementations, the sequence in which each of light emitting devices 103c is driven in the test pattern can be random, which is less likely to catch the eye of a viewer. However, other test patterns and/or sequences are within the scope of present implementations.

Figure 12:
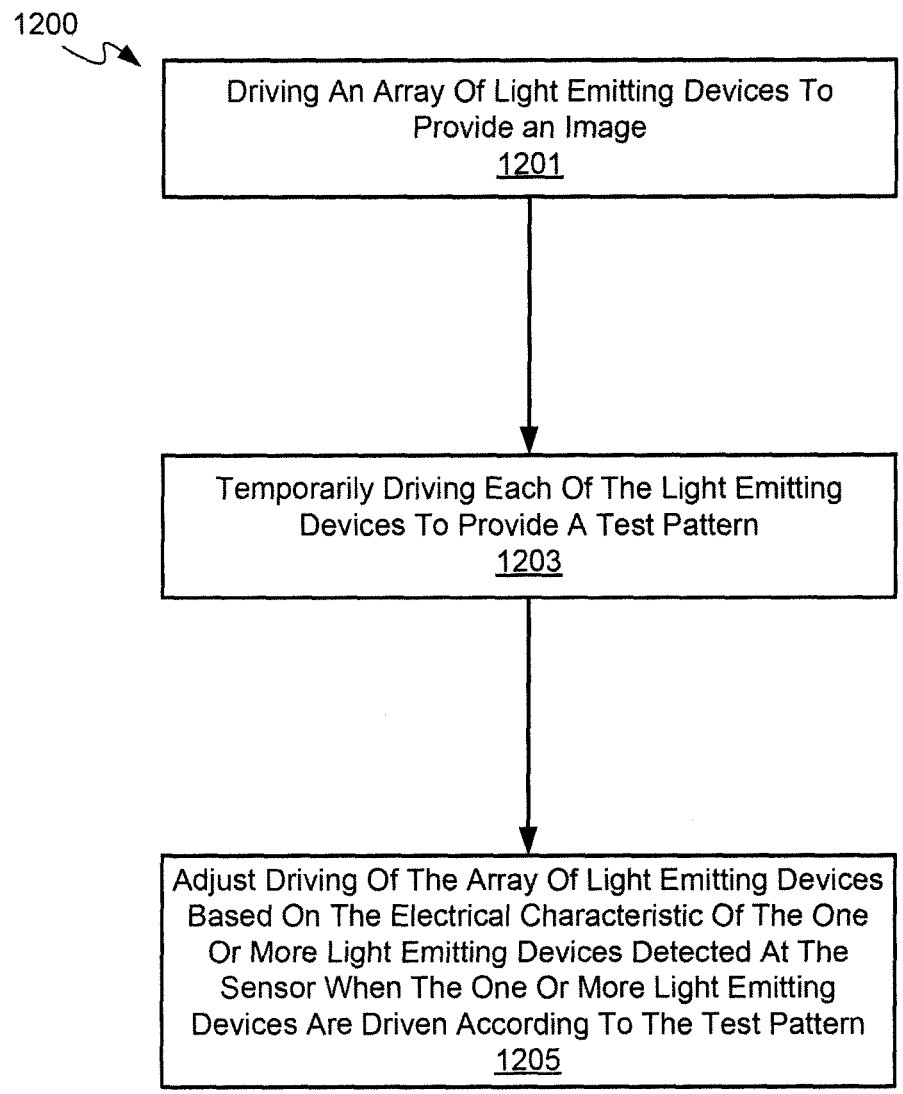
FIG. 12 depicts a method for dynamically monitoring and calibrating display tiles and/or light emitting tiles, according to alternative non-limiting implementations.

Attention is now directed to FIG. 12 which depicts a flowchart illustrating a method 1200 for dynamically monitoring and calibrating display tiles and/or light emitting tiles, according to non-limiting implementations. In order to assist in the explanation of method 1200, it will be assumed that method 1200 is performed using device 100c. Furthermore, the following discussion of method 1200 will lead to a further understanding of device 100c and its various components. However, it is to be understood that device 100c and/or method 1200 can be varied, and need not work exactly as discussed herein in conjunction with each other, and that such variations are within the scope of present implementations. It is appreciated that, in some implementations, method 1200 is implemented in device 100c by circuitry 109c and/or processor 120c. For example, circuitry 109c can store an application in memory 122c comprising instructions for implementing method 1200.

It is to be emphasized, however, that method 1200 need not be performed in the exact sequence as shown, unless otherwise indicated; and likewise various blocks may be performed in parallel rather than in sequence; hence the elements of method 1200 are referred to herein as "blocks" rather than "steps". It is also to be understood that method 1200 can be implemented on variations of device 100c as well.

At block 1201, circuitry 109c drives array 101c of light emitting devices 103c to provide an image. At block 1203, circuitry 109c temporarily drives each of light emitting devices 103c to provide a test pattern. At block 1205, circuitry 109c; adjusts driving of array 101c of light emitting devices 103c based on the electrical characteristic of the one or more light emitting devices 103c detected at sensor 1007c when the one or more light emitting devices 103c are driven according to the test pattern.

In any event, in this manner, aging of each individual light emitting device 103c can be tracked, for example, when method 1200 implemented periodically. Further, in some implementations, blocks 1201 and 1203 can be implemented simultaneously so that providing of the image at array 101c is not completely interrupted, but rather individual pixels/light emitting devices 103c of the image can be tested randomly and/or in a raster pattern and/or in another pattern.

Those skilled in the art will appreciate that in some implementations, the functionality of devices 100, 100a, 100b, 100c, 801 and computing device 802 can be implemented using pre-programmed hardware or firmware elements (e.g., application specific integrated circuits (ASICs), electrically erasable programmable read-only memories (EEPROMs), etc.), or other related components. In other implementations, the functionality of devices 100, 100a, 100b, 100c, 801 and computing device 802 can be achieved using a computing apparatus that has access to a code memory (not shown) which stores computer-readable program code for operation of the computing apparatus. The computer-readable program code could be stored on a computer readable storage medium which is fixed, tangible and readable directly by these components, (e.g., removable diskette, CD-ROM, ROM, fixed disk, USB drive). Furthermore, it is appreciated that the computer-readable program can be stored as a computer program product comprising a computer usable medium. Further, a persistent storage device can comprise the computer readable program code. It is yet further appreciated that the computer-readable program code and/or computer usable medium can comprise a non-transitory computer-readable program code and/or non-transitory computer usable medium. Alternatively, the computer-readable program code could be stored remotely but transmittable to these components via a modem or other interface device connected to a network (including, without limitation, the Internet) over a transmission medium. The transmission medium can be either a non-mobile medium (e.g., optical and/or digital and/or analog communications lines) or a mobile medium (e.g., microwave, infrared, free-space optical or other transmission schemes) or a combination thereof.

Persons skilled in the art will appreciate that there are yet more alternative implementations and modifications possible, and that the above examples are only illustrations of one or more implementations. The scope, therefore, is only to be limited by the claims appended hereto.

What is claimed is:

1. A device comprising:
a first light emitting device;
a second light emitting device paired with the first light emitting device, the first light emitting device and the second light emitting device each having one or more of a same initial color and a same initial brightness;
at least one sensor configured to detect one or more of an optical characteristic and an electrical characteristic of the second light emitting device; and,
circuitry configured to:
drive the second light emitting device under same conditions as the first light emitting device;
temporarily drive the second light emitting device under different conditions while continuing to drive the first light emitting device the same conditions so as to not interrupt operation of the first light emitting device;
determine one or more of the optical characteristic and the electrical characteristic of the second light emitting device at the at least one sensor when the second light emitting device is temporarily driven under the different conditions;
and,
adjust driving of the first light emitting device for aging of the first light emitting device as indicated by one or more of the optical characteristic and the electrical characteristic of the second light emitting device determined when the second light emitting device is temporarily driven under the different conditions.

2. The device of claim 1, further comprising a light guide configured to guide light from the second light emitting device to the at least one sensor.

3. The device of claim 1, wherein the first light emitting device is part of an array of light emitting devices.

4. The device of claim 1, further comprising a chassis, and the first light emitting device and the second light emitting device are located on opposite sides of the chassis.

5. The device of claim 1, wherein the circuitry is further configured to drive the second light emitting device in a test pattern when temporarily driving the second light emitting device under the different conditions from the first light emitting device.

6. The device of claim 1, wherein the optical characteristic comprises one or more of a color coordinate, a white point, and an intensity of the second light emitting device.

7. The device of claim 1, wherein the electrical characteristic comprises one or more of an operating power, an operating voltage and an operating current of the second light emitting device.

8. The device of claim 1, further comprising at least one or more temperature sensors configured to measure a temperature difference between the first light emitting device and the second light emitting device, wherein adjusting driving of the first light emitting device is further based on the temperature difference.

9. A method of use of a device comprising: a first light emitting device; a second light emitting device paired with the first light emitting device, the first light emitting device and the second light emitting device each having one or more of a same initial color and a same initial brightness; at least one sensor configured to detect one or more of an optical characteristic and an electrical characteristic of the second light emitting device; and circuitry, the method comprising:
driving, using the circuitry, the second light emitting device under same conditions as the first light emitting device;
temporarily driving, using the circuitry, the second light emitting device under different conditions while continuing to drive the first light emitting device the same conditions so as to not interrupt operation of the first light emitting device
determining, using the at least one sensor, one or more of the optical characteristic and the electrical characteristic of the second light emitting device when the second light emitting device is temporarily driven under the different conditions; and,
adjusting, using the circuitry, driving of the first light emitting device for aging of the first light emitting device as indicated by one or more of the optical characteristic and the electrical characteristic of the second light emitting device determined when the second light emitting device is temporarily driven under the different conditions.

10. The method of claim 9, further comprising further adjusting driving the first light emitting device based on a temperature difference between the first light emitting device and the second light emitting device.

11. A system comprising:
light emitting tiles, each comprising: a first light emitting device; a second light emitting device; at least one sensor configured to detect one or more of an optical characteristic and an electrical characteristic of the second light emitting device; and, circuitry configured to: drive the second light emitting device under same conditions as the first light emitting device; temporarily drive the second light emitting device under different conditions while continuing to drive the first light emitting device the same conditions so as to not interrupt operation of the first light emitting device; determine one or more of the optical characteristic and the electrical characteristic of the second light emitting device at the at least one sensor when the second light emitting device is temporarily driven under the different conditions; and, adjust driving of the first light emitting device for aging of the first light emitting device as indicated by one or more of the optical characteristic and the electrical characteristic of the second light emitting device determined when the second light emitting device is temporarily driven under the different conditions; and
at least one computing device in communication with the light emitting tiles, the at least one computing device configured to:
receive, from respective sensors of each of the light emitting tiles, one or more of a respective optical characteristic and a respective electrical characteristic of a respective second light emitting device when respectively driven under respective different conditions;
determine one or more of a common optical characteristic and a common electrical characteristic from one or more of the respective optical characteristic and the respective electrical characteristic; and,
communicate one or more of the common optical characteristic and the common electrical characteristic to one or more of the light emitting tiles so that respective circuitry can drive each respective first light emitting device according to one or more of the common optical characteristic and the common electrical characteristic.

12. The system of claim 11, where the common characteristic comprises one or more of a common white point, at least one common colour coordinate, a common intensity, a common operating power, a common operating voltage and a common operating current.

* * * * *